(12) United States Patent
Ogawa et al.

(10) Patent No.: US 8,698,105 B2
(45) Date of Patent: Apr. 15, 2014

(54) CHARGED PARTICLE BEAM APPARATUS AND METHOD OF ADJUSTING CHARGED PARTICLE OPTICS

(75) Inventors: Takashi Ogawa, Chiba (JP); Yo Yamamoto, Chiba (JP); Hiroshi Matsumura, Chiba (JP)

(73) Assignee: SII NanoTechnology (JP)

( * ) Notice: Subject to any disclaimer, the term of this patent is extended or adjusted under 35 U.S.C. 154(b) by 167 days.

(21) Appl. No.: 12/449,633

(22) PCT Filed: Feb. 4, 2008

(86) PCT No.: PCT/JP2008/051784
§ 371 (c)(1),
(2), (4) Date: Sep. 18, 2009

(87) PCT Pub. No.: WO2008/102635
PCT Pub. Date: Aug. 28, 2008

(65) Prior Publication Data
US 2010/0116984 A1  May 13, 2010

(30) Foreign Application Priority Data

Feb. 19, 2007 (JP) .................................. 2007-038274

(51) Int. Cl.
*G21G 5/00* (2006.01)
(52) U.S. Cl.
USPC ........ 250/492.1; 250/306; 250/307; 250/309; 250/310; 250/311; 250/492.2; 250/492.3
(58) Field of Classification Search
USPC .............. 250/306, 307, 309, 310, 311, 492.1, 250/492.2, 492.21, 492.22, 492.23, 492.3
See application file for complete search history.

(56) References Cited

U.S. PATENT DOCUMENTS 5,986,264 A * 11/1999 Grunewald .................... 250/310
2007/0181806 A1* 8/2007 Nakano et al. ................ 250/310
2007/0284538 A1* 12/2007 Zani et al. ..................... 250/398

FOREIGN PATENT DOCUMENTS

| JP | 63 78443 | 4/1988 |
| JP | 4 87246 | 3/1992 |
| JP | 10 92354 | 4/1998 |
| JP | 2001 229866 | 8/2001 |
| JP | 2002 134059 | 5/2002 |
| JP | 2005 333161 | 12/2005 |

* cited by examiner

*Primary Examiner* — Robert Kim
*Assistant Examiner* — Hanway Chang
(74) *Attorney, Agent, or Firm* — Adams & Wilks

(57) ABSTRACT

A charged particle beam apparatus which is able to adjust charged particle optics easily in a short time with a high degree of accuracy and a method of adjusting charged particle optics are provided. A charged particle beam apparatus 1 includes a charged particle source 9, charged particle optics 12, 16 configured to set the ion beam I to a bean characteristic value corresponding to an input value to cause a sample to be irradiated therewith, scanning means 17 configured to be able to move the irradiation point of the charged particle beam I relatively with each other, observing means 32 being capable of obtaining an image, and a control unit 30, and the control unit 30 includes spot pattern forming means 33 configured to set the input value to different values and cause the sample to be irradiated with the charged particle beam I by a plurality of times at different positions to form a plurality of spot patterns and spot pattern analyzing means 34 configured to select a spot pattern having a smallest characteristic value, and sets the input values of the charged particle optics 12, 16 to a value equal to the input value corresponding to the selected spot pattern.

21 Claims, 15 Drawing Sheets

CHARGED PARTICLE BEAM APPARATUS AND METHOD OF ADJUSTING CHARGED PARTICLE OPTICS

Cross-Reference to Related Applications

This application is a U.S. national stage application of International Application No. PCT/JP2008/051784 filed Feb. 4, 2008, claiming a priority date of Feb. 19, 2007, and published in a non-English language.

TECHNICAL FIELD

The present invention relates to a charged particle beam apparatus configured to irradiate a sample with a charged particle beam for processing and observation of the sample, and a method of adjusting charged particle optics in the charged particle beam apparatus.

BACKGROUND ART

In the related art, a charged particle beam apparatus configured to irradiate a predetermined position with a charged particle beam such as an ion beam or an electron beam for processing and observation is used in various fields. As the charged particle beam apparatus, there are, for example, a scanning electron microscope (SEM) which is able to irradiate with an electron beam as the charged particle beam or a focused ion beam apparatus (FIB) which is able to irradiate with a focused ion beam or the like as the charged particle beam. The scanning electron microscope allows observation of the state of a surface of a sample by detecting a secondary electron generated from the surface of the sample while scanning with the electron beam on the surface of the sample. Also, the focused ion beam apparatus allows observation of the surface of the sample by detecting the secondary electron in the same manner as the scanning electron microscope and also is able to perform etching or deposition of the sample by increasing the acceleration voltage, so that it is used for preparing samples for TEM (transmission electron microscope) or correcting photomasks. Also, in recent years, in the focused ion beam apparatus, a method of realizing a low-damage processing by using the acceleration voltage of the focused ion beam in a low-acceleration area from 100 V to 5000 V in acceleration voltage receives attention. A method for realizing a large surface processing such as wire bonding or solder bump by using the same in a heavy-current area of at least 1 nA in amount of irradiation of the focused ion beam within a range on the order of 3000 V in acceleration voltage or the like also starts to receive attention.

Incidentally, the charged particle beam apparatuses as described above include charged particle optics configured to adjust beam characteristic values, such as the focal length or the astigmatism, of the charged particle beam by electromagnetically acting on the irradiated charged particle beam in order to achieve an adequate observation or processing. In other words, the focused ion beam apparatus, for example, includes an electrostatic lens as an objective lens which causes the focused ion beam to be focused by forming an electric field by an applied voltage as the charged particle optics. Then, by setting a voltage value to be applied to the electrostatic lens as an input value, the focal length is adjusted and the focused ion beam is focused on the surface of the sample. Also, although the electrostatic lens as described above is formed to have rotational symmetry for causing the focused ion beam to be focused uniformly in the circumferential direction, the astigmatism might occur due to the fabrication in accuracy of a lens electrode and axis displacement at the time of assembly, so that the shape of the cross-section of the focused ion beam might not assume a circle. Therefore, an astigmatic correction mechanism (stigmator) configured to correct the astigmatism of the focused ion beam is used as the charged particle optics. The astigmatism correction mechanism corrects the astigmatism of the focused ion beam by forming an electric field by, for example, using two pairs of quadrupoles and setting voltage values to be applied to the respective quadrupoles as input values. The scanning electron microscope or the like is also the same in this respect and includes a magnetic field lens as the objective lens and the astigmatic correction mechanism, each forming a magnetic field which acts on the electron beam to adjust the focal length and correct the astigmatism.

In the related art, the displacement of the position of the focal point or the astigmatism as described above are adjusted and corrected specifically in the following method using the above-described charged particle optics. In other words, an image of the sample is obtained by detecting the secondary electron by irradiating the sample with the charged particle beam. Then, the direction of the astigmatism is determined from the state of the obtained image, and an input value to be inputted to an astigmatic corrector is adjusted according to the direction of the astigmatism. Furthermore, the image of the sample is obtained, and whether or not the image is in focus is determined from the state of the image, and the input value to be inputted to the objective lens is adjusted according to the state. Then, if there is further a sign of astigmatism in the obtained image, the correction of the astigmatism and the adjustment of the position of the focal point are performed again. Then, when the obtained image becomes clear without any distortion, the adjustment is completed (for example, see Non-Patent Document 1).

Also, as regards an electron beam exposure apparatus as the charged particle beam apparatus, a technology to prevent generation of variations due to an abrupt change of the input value for correcting the astigmatism when performing a linear supplement by determining optimal input values at the respective lattice points on a field according to the method as described above is disclosed (for Example, see Patent Document 1).

[Non-Patent Document 1] Fundamentals and Application of Scanning Electron Microscope, from Kyoritsu Publ. Co., Ltd., Oct. 25, 1991, pp. 80-82

[Patent Document 1] JP-A-8-83585

However, with the methods disclosed in Non-Patent Document 1 and Patent Document 1, an operator determines the state of the obtained image qualitatively and determines optimal values as input values of the respective charged particle optics. Therefore, there is a problem that a high level of performance of the operator and a great deal of time are necessary for adjusting the respective charged particle optics. Also, there arise variations in accuracy of adjustment from operator to operator, and even though the adjustment is made by the same operator, it is difficult to unify the accuracy of adjustment in different apparatuses, so that variations in performance from apparatus to apparatus may be disadvantageously resulted. In the focused ion beam apparatus as described above, since the speed of processing is fast when used in a heavy-current area, the sample might be damaged while acquiring and adjusting the image of the sample. Furthermore, since the ion beam cannot be focused effectively when being used in the heavy-current area or a low-acceleration area in comparison with the use in a low-current area and a high-acceleration area, a clear image cannot be obtained as the image of the sample for adjustment, so that the accurate adjustment cannot be achieved.

SUMMARY OF THE INVENTION

In view of such circumstances as described above, it is an object of the present invention to provide a charged particle beam apparatus which is able to adjust charged particle optics easily in a short time with a high degree of accuracy and a method of adjusting charged particle optics.

In order to solve the above-described problems, the present invention proposes the following means.

A charged particle beam apparatus according to the present invention includes a charged particle source configured to discharge a charged particle beam; charged particle optics configured to act electromagnetically on the basis of an input value, and set the charged particle beam to a beam characteristic value corresponding to the input value and cause a sample to be irradiated therewith; scanning means configured to be able to move an irradiation point of the charged particle beam with respect to the sample; observing means configured to be able to obtain an image of a surface of the sample, and a control unit configured to be able to adjust the input value of the charged particle optics so that the beam characteristic value of the charged particle beam becomes a desired value, characterized in that the control unit includes spot pattern forming means configured to set the input value of the charged particle optics to different values and cause the sample to be irradiated with the charged particle beam by a plurality of times at positions differentiated by the scanning means to form a plurality of spot patterns on the surface of the sample and spot pattern analyzing means configured to select the spot pattern having the smallest spot characteristic value which indicates the shape of the respective spot patterns formed on the sample from the image obtained by the observing means, and sets the input value of the charged particle optics to a value equal to the input value corresponding to the charged particle beam applied when the spot pattern selected by the spot pattern analyzing means is formed.

Also, the present invention is a method of adjusting charged particle optics with a charged particle beam apparatus including the charged particle optics configured to act electromagnetically on the basis of an input value and set a charged particle beam to a beam characteristic value corresponding to the input value, and being configured to cause a sample to be irradiated with the charged particle beam for adjusting the input value of the charged particle beam so that the beam characteristic value of the charged particle beam becomes a desired value including; a spot pattern forming step for forming a plurality of spot patterns on a surface of a sample by setting the input values of the charged particle optics to different values and irradiating the sample prepared in advance with the charged particle beams by a plurality of times at differentiated positions, a spot pattern analyzing step for selecting the spot pattern having the smallest value from spot characteristic values which indicate the shapes of the respective spot patterns, and an input value setting step for setting the input value of the charged particle optics to a value equal to the input value corresponding to the charged particle beam applied when the spot pattern selected in the spot pattern analyzing step is formed.

According to the charged particle beam apparatus and the method of adjusting charged particle optics of the present invention, the plurality of spot patterns are formed on the surface of the sample as the spot pattern forming step. In other words, the spot pattern forming means of the control unit ejects the charged particle beam from the charged particle source. Then, by causing the charged particle beams to electromagnetically act on the basis of the input value by the charged particle optics, the surface of the sample is irradiated with the charged particle beam in a state of having a certain beam characteristic value. Accordingly, a spot pattern of shape having a certain spot characteristic value is formed on the surface of the sample according to the beam characteristic value of the applied charged particle beam. Subsequently, the spot pattern forming means of the control unit sets the input value of the charged particle optics to a different value and causes the charged particle beam to be applied again at a position differentiated from the previous irradiation point by the scanning means. In this manner, a plurality of spot patterns having different spot characteristic values are formed on the different positions on the surface of the sample respectively.

Subsequently, as the spot pattern analyzing step, the formed plurality of spot patterns are analyzed. In other words, the spot pattern analyzing means of the control unit measures the spot characteristic values of the respective spot patterns from an image obtained by the observing means, and selects the spot pattern having the smallest spot characteristic value. Then, the control unit extracts the input value corresponding to the charged particle beam applied when the selected spot pattern is formed and sets the input value of the charged particle optics to a value which is equal thereto as the input value setting step. Accordingly, the charged particle beam which is electromagnetically acted upon by the charged particle optics can be applied on the sample in such a manner that the spot characteristic value of the spot pattern formed on the sample become the smallest, that is, the beam characteristic value is set to a desired value.

Also, in the charged particle beam apparatus described above, it is considered to be preferable that the spot pattern forming means of the control unit moves the irradiation point of the charged particle beam with respect to the sample by the scanning means by an amount obtained by multiplying the amount of change of the input value by a predetermined coefficient every time when the charged particle beam is applied on the sample after setting the input value to the different value.

Also, in the method of adjusting charged particle optics described above, the spot pattern forming step preferably moves an irradiation point of the charged particle beam with respect to the sample by an amount obtained by multiplying an amount of change of the input value by a predetermined coefficient every time when the charged particle beam is applied on the sample after setting the input value to the different value.

According to the charged particle beam apparatus and the method of adjusting the charged particle optics of the present invention, the spot pattern forming means of the control unit relatively moves the irradiation point of the charged particle beam by an amount obtained by multiplying the amount of change of the input value by a predetermined coefficient every time when the charged particle beam is applied in the spot pattern forming step. Accordingly, the plurality of spot patterns are formed on the surface of the sample at distances corresponding to the amount of the change of the input value. Therefore, from the state of the shapes and arrangement of the spot patterns, the spot pattern having the smallest spot characteristic value can be selected more easily and, on the basis of this, the input value of the charged particle optics can be set so that the beam characteristic value of the charged particle beam becomes a desired value.

Also, in the charged particle beam apparatus described above, it is considered to be preferable that the spot pattern analyzing means of the control unit determines whether the smallest spot characteristic value is larger than a preset spot reference value or not and, if the smallest spot characteristic value is larger than the spot reference value, and the spot pattern forming means of the control unit changes the input value by an amount of change smaller than the amount of change of the input value when the charged particle beam is applied after changing the input value of the charged particle optics in the previous time to form the spot pattern again.

Also, in the method of adjusting charged particle optics described above, it is considered to be preferable that the spot pattern analyzing step compares the smallest spot characteristic value and a preset spot reference value and, if the spot characteristic value is larger than the spot reference value, the procedure goes again to the spot pattern forming step, and the spot pattern forming step changes the input value by an amount of change smaller than the amount of change when the input value of the charged particle optics is changed in the previous spot pattern forming step to form the spot pattern.

According to the charged particle beam apparatus and the method of adjusting charged particle optics of the present invention, in the spot pattern analyzing step, the spot pattern analyzing means of the control unit compares the smallest spot characteristic value and the preset spot reference value. Then, if the spot characteristic value is larger than the spot reference value, that is, if the spot characteristic value is the smallest, but an amount of change between the plurality of input values set by the spot pattern forming means is large and there exists an input value at which the spot characteristic value becomes smaller as an intermediate value, the spot pattern forming step is performed again. Then, in the spot pattern forming step, by changing the input value by the amount of change smaller than that in the previous spot pattern forming step by the spot pattern forming means, search and adjustment of the input value which achieves a desired beam characteristic value with a higher degree of accuracy on the basis of the spot characteristic value of the formed spot pattern.

Also, in the charged particle beam apparatus described above, it is considered to be preferable that the spot pattern analyzing means of the control unit determines whether the input value corresponding to the spot pattern having the smallest spot characteristic value is the smallest or the largest in comparison with the input values corresponding to the other spot patterns and, if the input value corresponding to the spot pattern having the smallest spot characteristic value is the smallest, the spot pattern forming means of the control unit changes the input value within a range including values smaller than the input value and within a range including values larger than the input value if the input value is the largest to form the spot pattern again.

Also, in the method of adjusting charged particle optics described above, it is considered to be preferable that in the spot pattern analyzing step, the input value corresponding to the spot pattern having the smallest spot characteristic value is compared with the input values corresponding to the other spot patterns and, if the input value corresponding to the spot pattern having the smallest spot characteristic value is the smallest or the largest, the procedure goes to the spot pattern forming step again, and in the spot pattern forming step the input value is changed within a range including values smaller than the input value if the input value corresponding to the spot pattern having the smallest spot characteristic value is the smallest, and within a range including values larger than the input value if the input value is the largest to form the spot pattern again.

According to the charged particle beam apparatus and the method of adjusting charged particle optics of the present invention, in the spot pattern analyzing step, the spot pattern analyzing means of the control unit compares the input value of the charged particle optics set when the spot pattern having the smallest spot characteristic value is formed and the input value of the charged particle optics set when other spot patterns are formed. Then, if the input value corresponding to the spot pattern having the smallest spot characteristic value is the smallest or the largest in comparison with the input values corresponding to the other spot patterns, that is, if the spot characteristic value is the smallest but there exists an input value at which the spot characteristic value becomes smaller out of the range of the input values changed by the stop pattern forming means, the spot pattern forming step is performed again. Then, in the spot pattern forming step, by changing the input value within a range including smaller values if the input value corresponding to the spot pattern having the smallest spot characteristic value is the smallest and in a range including larger values if the input value is the largest by the spot pattern forming means, search and adjustment of the input value which achieves a desired beam characteristic value with a higher degree of accuracy on the basis of the spot characteristic value of the formed spot pattern.

Also, in the charged particle beam apparatus described above, it is considered to be preferable that the spot pattern analyzing means converts the image obtained from the observing means into binarized binary data and selects the spot pattern having the smallest spot characteristic value from the binary data.

Also, in the method of adjusting charged particle optics described above, it is considered to be preferable that the spot pattern analyzing step creates binary data obtained by binarizing an image of the sample on which the spot pattern is formed, and selects the spot pattern having the smallest spot characteristic value from the binary data.

According to the charged particle beam apparatus and the method of adjusting charged particle optics of the present invention, in the spot pattern analyzing step, by converting the image into the binarized binary data by the spot pattern analyzing means of the control unit, the spot pattern displayed in the image is identified more clearly, and hence adjustment of the input value with a higher degree of accuracy is achieved on the basis of the spot characteristic value of the spot pattern.

Also, in the charged particle beam apparatus described above, it is considered to be preferable that the charged particle optics includes an electrostatic lens configured to focus the charged particle beam to cause the sample to be irradiated therewith by applying a voltage to an electrode, the control unit causes the spot pattern forming means to form the spot patterns by setting the voltage values to be applied to the electrode of the electrostatic lens to different values as the input values and causes the spot pattern analyzing means to select the spot pattern having the smallest spot characteristic value as the outer diameter of the spot pattern, and set the voltage value to the voltage value corresponding to the spot pattern having the smallest value, so that the focal length of the electrostatic lens as the beam characteristic value is adjusted.

Also, in the method of adjusting charged particle optics described above, it is considered to be preferable that the charged particle beam apparatus includes an electrostatic lens configured to focus the charged particle beam to cause the sample to be irradiated therewith by applying a voltage to an electrode as the charged particle optics, the spot pattern forming step forms the spot patterns by setting voltage values to be applied to the electrode of the electrostatic lens to different values as the input values, and the spot pattern analyzing step selects the spot pattern having the smallest spot characteristic value as the outer diameter of the spot pattern, and sets the voltage value by the input value setting step, so that the focal length of the electrostatic lens as the beam characteristic value is adjusted.

According to the charged particle beam apparatus and the method of adjusting charged particle optics of the present invention, as the spot pattern forming step, the spot pattern forming means of the control unit changes the voltage value to be applied to the electrode of the electrostatic lens to various values, whereby the charged particle beam is applied with various focal length to form the plurality of spot patterns. Then, the spot pattern analyzing means of the control unit selects a spot pattern having the smallest outer diameter, that is, a spot pattern on the surface of the sample by being irradiated with the charged particle beam in a most focalized state. Therefore, by setting the input value to the input value corresponding to this spot pattern by the control unit as the input value setting step, the focal length as the beam characteristic value of the charged particle beam can be adjusted to be substantially equal to the separation distance between the electrostatic lens and the surface of the sample, so that the smallest beam diameter is obtained.

Also, in the charged particle beam apparatus described above, it is also possible to configure in such a manner that a stigmator which includes at least a set of multi-poles having a pair of opposed positive poles and a pair of negative poles opposed in substantially orthogonally to the direction of arrangement of the positive poles and corrects the cross-sectional shape of the charged particle beam into a substantially circular shape by applying a voltage between the positive pole and the negative pole of the multi-pole and applies the same to the sample is provided as the charged particle optics, the control unit causes the spot pattern forming means to set the voltage value to be applied between the positive poles and the negative poles of the stigmator to different values as the input values to form the spot patterns and causes the spot pattern analyzing means to select the spot pattern having the smallest spot characteristic value as the ratio of the short diameter with respect to the long diameter of the outer diameters of the spot pattern in the orthogonal two directions, and set the voltage value to the voltage value corresponding to the spot pattern having the smallest value, so that the beam diameter ratio in the orthogonal two directions of the charged particle beam as the beam characteristic value is adjusted.

Also, in the method of adjusting charged particle optics described above, it is also possible to configure in such a manner that the charged particle beam apparatus includes, as the charged particle optics, a stigmator which includes at least a set of multi-poles having a pair of opposed positive poles and a pair of negative poles opposed in substantially orthogonally to the direction of arrangement of the positive poles as the charged particle optics and corrects the cross-sectional shape of the charged particle beam into a substantially circular shape by applying a voltage between the positive pole and the negative pole of the multi-pole and applies the same to the sample, the voltage value to be applied between the positive poles and the negative poles of the stigmator is set to different values as the input values to form the spot patterns in the spot pattern forming step, the spot pattern having the smallest spot characteristic value is selected as the ratio of the short diameter with respect to the long diameter of the outer diameters of the spot pattern in the orthogonal two directions in the spot pattern analyzing step, and the voltage value is set in the input value setting step, so that the beam diameter ratio in the orthogonal two directions of the charged particle beam as the beam characteristic value is adjusted.

According to the charged particle beam apparatus and the method of adjusting charged particle optics of the present invention, as the spot pattern forming step, the spot pattern forming means of the control unit changes the voltage value to be applied between the positive poles and the negative poles of the multi-pole of the stigmator to various values, whereby the charged particle beam is applied with various cross-sectional shapes of the charged particle beam to form the plurality of spot patterns. Then, as the spot pattern analyzing step, the spot pattern analyzing means of the control unit selects a spot pattern having the smallest ratio of the long diameter with respect to the short diameter in the outer diameters in the two orthogonal direction, that is, being formed by being irradiated with the charged particle beam in a cross-sectional shape closest to a circle. Therefore, by setting the input value to the input value corresponding to this spot pattern by the control unit as the input value setting step, the beam diameter ratio in orthogonal two directions as the beam characteristic value of the charged particle beam can be adjusted to be substantially equal to 1 which assumes a circle.

Also, in the charged particle beam apparatus described above, it is considered to be preferable that the spot pattern forming means of the control unit brings the charged particle beam into an over focus state with respect to the sample and forms the plurality of the spot patterns on the surface of the sample with different voltage values, then, brings the charged particle beam into an under focus state with respect to the sample and forms the plurality of the spot patterns of the surface of the sample with the same voltage values as in the case of the over focus state respectively, and the spot pattern analyzing means of the control unit performs pattern matching between the spot patterns formed in the over focus state and in the under focus state with the same voltage values and selects the set of the spot patterns whose ratio of matching of the pattern matching elements becomes highest.

Also, in the method of adjusting charged particle optics described above, it is considered to be preferable that the spot pattern forming step includes a first step of bringing the charged particle beam into an over focus state with respect to the sample and forming the plurality of the spot patterns on a surface of the sample with different voltage values, and a second step of bringing the charged particle beam into an under focus state with respect to the sample and forming the plurality of the spot patterns of the surface of the sample with the same voltage values as in the first step respectively, and the spot pattern analyzing step performs pattern matching between the spot patterns formed in the first step and in the second step with the same voltage values and selects the set of the spot patterns whose ratio of matching of the pattern matching elements becomes highest.

According to the charged particle beam apparatus and the method of adjusting charged particle optics of the present invention, in the spot pattern forming step, the spot pattern forming means of the control unit brings the charged particle beam into the over focus state with respect to the sample to form the plurality of spot patterns with the different voltage values applied to the multi-pole of the stigmator as the first step. Then, as the second step, the charged particle beam is brought into the under focus state with respect to the sample to form the spot patterns with the same voltage values as in the first step respectively. Here, if the voltage value is the same and the state of the focal point is different such as the over focus and the under focus, the directions of the charged particle beams are different by approximately 90 degrees, that is, the directions of the formed spot patterns are different also by approximately 90 degrees. Therefore, by performing the pattern matching between the spot patterns formed with the same voltage values by the spot pattern analyzing means as the spot pattern analyzing step, the both do not match if the cross-sectional shape of the charged particle beam is an oval shape. In contrast, the both match if it is a circular shape. In other words, in the spot pattern analyzing step, by selecting the set of the spot patterns whose rate of matching of the pattern matching element is the highest, the spot pattern having the smallest ratio of the long diameter with respect to the short diameter in the outer diameters in the two orthogonal directions can be selected more easily.

In addition, in the charged particle beam apparatus described above, it is considered to be preferable that the spot pattern forming means of the control unit matches the arrangement of the plurality of the spot patterns to the corresponding voltage values between the state of the over focus and in the state of under focus to form the spot patterns.

In addition, in the method of adjusting charged particle optics described above, it is considered to be preferable that the first step and the second step of the spot pattern forming step match the arrangement of the plurality of the spot patterns to the corresponding voltage values to form the spot patterns.

According to the charged particle beam apparatus and the method of adjusting charged particle optics of the present invention, in the spot forming step, the spot pattern forming means of the control unit matches the arrangement of the plurality of spot patterns to the corresponding voltage values to form the spot pattern in the state of the over focus in the first step and in the state of under focus in the second step. Then, in the spot pattern analyzing step, pattern matching of the spot patterns formed with the same voltage values is performed. Here, the arrangements and the corresponding voltages of the spot patterns formed respectively in the state of over focus in the first step and in the state of under focus in the second step match with each other. Therefore, by obtaining the image including the plurality of spot patterns by the observing means in the state of the over focus and in the state of the under focus respectively, pattern matching for all the sets of the spot patterns can be performed in a collective manner, so that the spot pattern having the smallest spot characteristic value can be selected further easily.

Also, in the charged particle beam apparatus described above, it is also possible to configure in such a manner that the stigma includes two sets of the multi-pole including a first multi-pole and a second multi-pole, the voltage value includes a set of a first voltage value to be applied between the positive pole and the negative pole of the first multi-pole and a second voltage value to be applied between the positive pole and the negative pole of the second multi-pole, the spot pattern forming means of the control unit combines the first voltage value and the second voltage value in different manners, moves the charged particle beam in a first direction by an amount obtained by multiplying an amount of change of the first voltage value by a predetermined coefficient and in a second direction intersecting the first direction by an amount obtained by multiplying an amount of change of the second voltage value by the coefficient relatively with respect to the sample by the scanning means, and causes the same to be applied by a plurality of times.

Also, in the method of adjusting charged particle optics described above, it is also possible to configure in such a manner that the stigma of the charged particle beam apparatus includes two sets of the multi-pole including a first multi-pole and a second multi-pole, the voltage value includes a first voltage value to be applied between the positive pole and the negative pole of the first multi-pole and a second voltage value to be applied between the positive pole and the negative pole of the second multi-pole and, in the spot pattern forming step, the first voltage value and the second voltage value are combined in different manners, and the charged particle beam is moved in a first direction by an amount obtained by multiplying an amount of change of the first voltage value by a predetermined coefficient and in a second direction intersecting the first direction by an amount obtained by multiplying an amount of change of the second voltage value by the coefficient relatively with respect to the sample, and applied by a plurality of times.

According to the charged particle beam apparatus and the method of adjusting charged particle optics of the present invention, as the spot pattern forming step, the spot pattern forming means of the control unit applies the charged particle beam by differentiating the combination of the first voltage value of the first multi-pole and the second voltage value of the second multi-pole of the stigmator to form the plurality of spot patterns. Here, when forming the spot patterns by changing the first voltage value and the second voltage value, the irradiation point is moved in the first direction by an amount obtained by multiplying the amount of change of the first voltage value by a predetermined coefficient and is moved in the second direction by an amount obtained by multiplying the amount of change of the second voltage value by the same coefficient by the scanning means. Therefore, the spot pattern having the smallest ratio of the long diameter with respect to the short diameter in the outer diameters in the orthogonal two directions can be selected easily from the shapes and the arrangement of the spot patterns and, on the basis of this, the first voltage value of the first multi-pole and the second voltage value of the second multi-pole can be set so that the beam diameter ratio in the two orthogonal directions is substantially equal to 1, which is a circular shape.

Also, in the charged particle beam apparatus described above, it is considered to be preferable to provide a sample base on which at least the two samples can be arranged, and which is capable of moving the samples at least within a plane substantially orthogonal to the direction of application of the charged particle beam.

Also, in the method of adjusting charged particle optics described above, it is considered to be preferable to include an adjustment preparation step for arranging a standard sample and a target sample as the sample, a processing and observation preparation step for adjusting the position of the target sample with respect to the irradiation point of the charged particle beam, and after the adjustment preparation step, the spot pattern forming step, the spot pattern analyzing step, and the input value setting step for the standard sample, and after the input value setting step, the procedure is migrated to the processing and observation preparation step.

According to the charged particle beam apparatus and the method of adjusting charged particle optics of the present invention, the adjustment of the charged particle optics can be performed by using the standard sample by arranging the standard sample and the target sample on the sample base as the adjustment preparation step and performing the spot pattern forming step, the spot pattern analyzing step, and the input value setting step and, after the adjustment, the processing and observation of the target sample is achieved by moving the target sample to the irradiation point of the charged particle beam quickly without necessity of replacement of the sample as the observation and processing preparation step.

[Advantages]

According to the charged particle beam apparatus of the present invention, the control unit includes the spot pattern forming means and the spot pattern analyzing means, and the input value of the charged particle optics can be adjusted so that the beam characteristic value of the charged particle beam becomes a desired value automatically and easily in a short time with a high degree of accuracy only by forming the plurality of spot patterns.

Also, according to the method of adjusting charged particle optics of the present invention, the spot pattern forming step, the spot pattern analyzing step, and an input value determining step are provided, and the input value of the charged particle optics can be adjusted so that the beam characteristic value of the charged particle beam becomes a desired value easily in a short time with a high degree of accuracy only by forming the plurality of spot patterns so that application of automation is also possible.

DETAILED DESCRIPTION OF THE INVENTION

Figure 1:
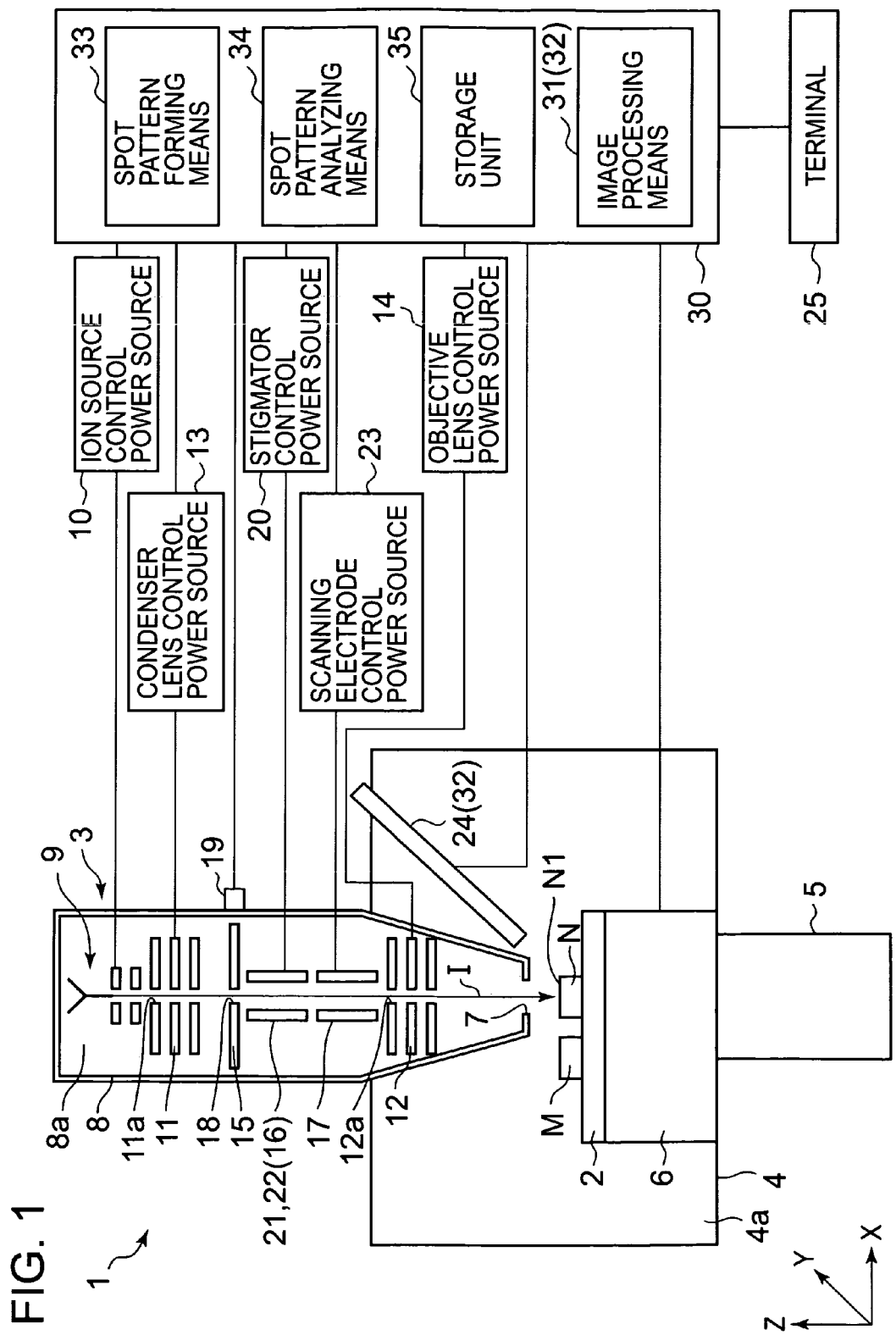
FIG. 1 is a configuration drawing of a charged particle beam apparatus according to a first embodiment of the present invention.

REFERENCE NUMERALS 1, 40, 50, 60 focused ion beam apparatus (charged particle beam apparatus)
2 sample base
9 ion source (charged particle source)
12 objective lens (charged particle optics)
17 scanning electrode (scanning means)
21 first multi-pole (multi-pole)
22 second multi-pole (multi-pole)
21a, 22a positive pole
21b, 22b negative pole
30 control unit
32 observing means
33 spot pattern forming means
34 spot pattern analyzing means
I ion beam (charged particle beam)
M target sample (sample)
N standard sample (sample)
N1 surface
A1-A12 voltage value (input value)
C1-C12 voltage value (input value)
D1-D16 first voltage value
E1-E16 second voltage value
F1-F16 irradiating position
P1-P6, Pa1-Pa8, Pb9-Pb12, Q1-Q16, Q'1-Q'16, R spot pattern
V1-V6, Vb4 outer diameter
W1-W16 outer diameter ratio (long diameter with respect to short diameter)
S1 adjustment preparation step
S11 spot pattern forming step
S12 spot pattern analyzing step
S13 input value setting step
S21 spot pattern forming step
S22, S32 spot pattern analyzing step
S23 input value setting step (First Embodiment)

FIG. 1 shows a first embodiment of the present invention. As shown in FIG. 1, a focused ion beam apparatus (FIB) 1 as a charged particle beam apparatus is configured to perform processing of a surface of a sample by irradiating the sample with an ion beam I as a charged particle beam. For example, it is possible to arrange a wafer as a sample and fabricate a sample for observation by a TEM (transmission electron microscope) or to correct a photomask using a photomask in the photolithography technology as a sample. Detailed description of the focused ion beam apparatus 1 in this embodiment will be given below.

As shown in FIG. 1, the focused ion beam apparatus 1 includes a sample base 2 on which at least two samples of a target sample M and a standard sample N can be arranged, and an ion beam column 3 which is able to irradiate the target sample M and the standard sample N arranged on the sample base 2 with the ion beam I. Here, the target sample M means a sample to be processed or observed by the focused ion beam apparatus 1, and the standard sample N means a sample used for adjustment of charged particle optics, described later. The sample base 2 is arranged in an interior 4a of a vacuum chamber 4. The vacuum chamber 4 includes a vacuum pump 5, which is able to exhaust air to bring the interior 4a into a high-vacuum atmosphere. The sample base 2 is provided with a five-axis stage 6, and is able to move the target sample M and the standard sample N in a Z-direction, which is the direction of irradiation of the ion beam I and in a X-direction and a Y-direction which are two axes substantially orthogonal to the Z-direction, and is able to incline the same about the axis substantially parallel to the X-direction and the Z-direction.

The ion beam column 3 includes a cylindrical member 8 formed with an irradiation port 7 which communicates with the vacuum chamber 4 at a distal center thereof and an ion source 9 as a charged particle source stored on the proximal end side in an interior 8a of the cylindrical member 8. As ion which constitutes the ion source 9, for example, gallium ion ($Ga^+$) or the like is exemplified. The ion source 9 is connected to an ion source control power source 10. Then, by applying an acceleration voltage and a drawing voltage by the ion source control power source 10, the ion drawn from the ion source 9 is accelerated and may be ejected as the ion beam I.

Also, in the interior 8a of the cylindrical member 8, a condenser lens 11 and an objective lens 12 configured to focus the ion beam I ejected from the ion source 9 are provided on the distal side from the ion source as the charged lens optics which electromagnetically acts on the ion beam I. The condenser lens 11 and the objective lens 12 are adjusted so that center axes thereof match with respect to each other in a state of being substantially parallel to the Z-direction. The condenser lens 11 and the objective lens 12 are electrostatic lenses including three electrodes respectively formed with through holes 11a, 12a, and are connected to a condenser lens control power source 13 and an objective lens control power source 14, respectively. By applying a voltage to the condenser lens 11 by the condenser lens control power source 13, the ion beam I in a dispersed state. passing through the through hole 11a is focused. Furthermore, by applying a voltage at a certain voltage value as an input value to the objective lens 12 by the objective lens control power source 14, the ion beam I passing through the through hole 12a can further be focused and be applied on the target sample M and the standard sample N while setting the focal length as beam characteristic values.

Also, provided between the condenser lens 11 and the objective lens 12 are a movable aperture 15, a stigmator 16, and a scanning electrode 17 as scanning means in sequence from the proximal side. The movable aperture 15 includes an aperture 18 as a through hole having a predetermined diameter, and an aperture drive unit 19 configured to cause the aperture 18 to move in the X-direction and the Y-direction. The aperture 18 is configured to squeeze the ion beam I applied from the condenser lens 11 according to the diameter thereof. In this embodiment, although only one aperture 18 is provided, it is also possible to provide a plurality of apertures 18 having different diameters, and configure the apertures to be able to select the one having a preferable diameter by moving the same by the aperture drive unit 19.

Figure 2:
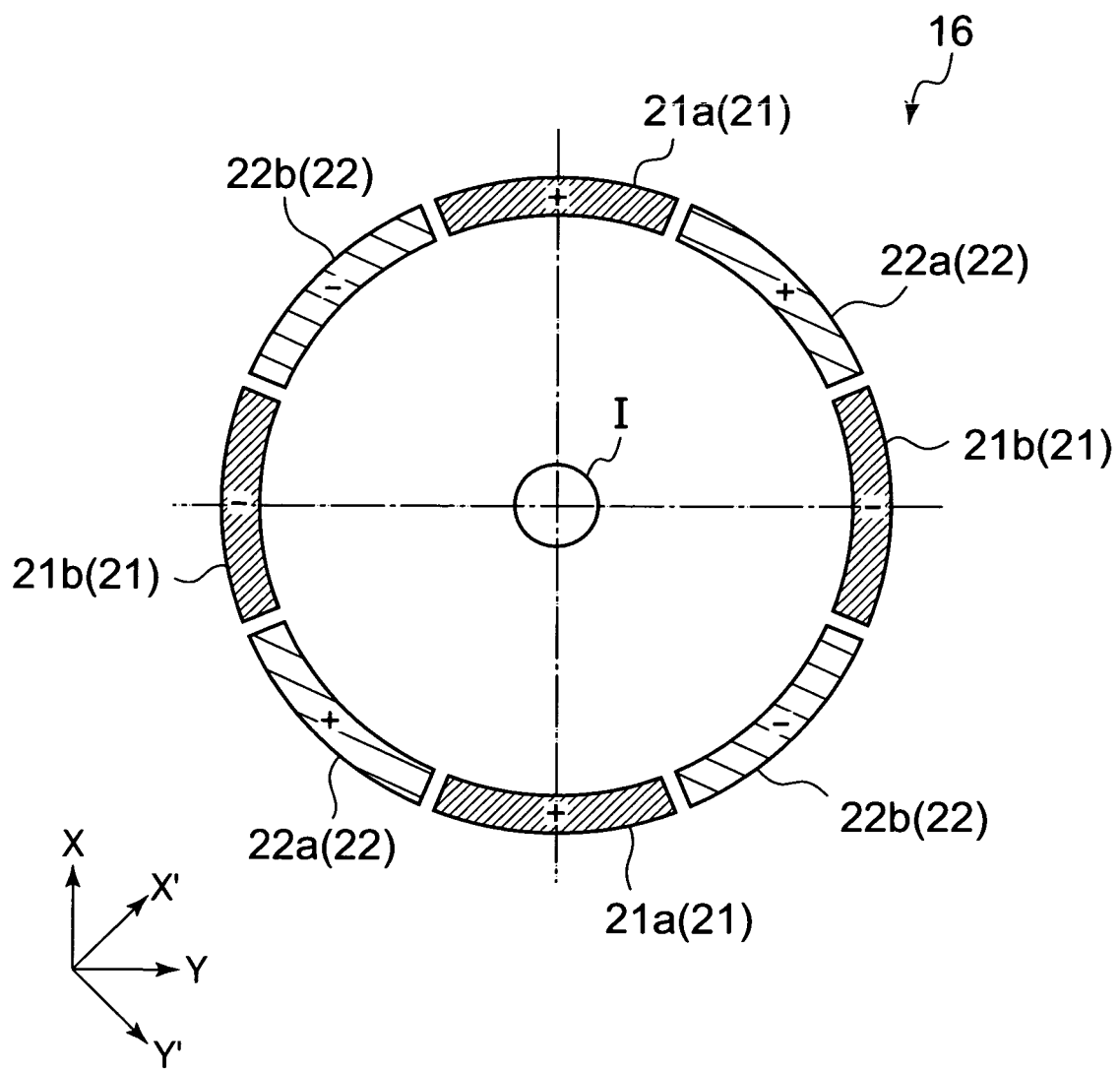
FIG. 2 is a detailed drawing of a stigmator in the charged particle beam apparatus according to the first embodiment of the present invention.

Also, the stigmator 16 is configured to perform astigmatic correction of the ion beam I passing therethrough as the charged particle optics which electromagnetically acts on the ion beam I, which is achieved by applying a voltage from a stigmator control power source 20. More specifically, the stigmator 16 includes a first multi-pole 21 and a second multi-pole 22. As shown in FIG. 2, the first multi-pole 21 of the stigmator 16 is a multi-pole having four poles including a pair of positive poles 21a, 21a opposed to each other, and a pair of negative poles 21b, 21b opposed to each other substantially orthogonally to the direction of arrangement of the pair of positive poles 21a, 21a. In the same manner, the second multi-pole 22 is a multi-pole having four poles including a pair of positive poles 22a, 22a opposed to each other and a pair of negative poles 22b, 22b opposed to each other substantially orthogonal to the direction of arrangement of the pair of positive poles 22a, 22a. Then, the directions of arrangement of the positive pole 22a and the negative pole 22b of the second multi-pole 22 are shifted by approximately 45 degrees with respect to the directions of arrangement of the corresponding positive pole 21a and the negative pole 21b of the first multi-pole 21, so that an eight-pole is configured by arranging the positive poles 21a, 22a and the negative poles 21b, 22b of them are arranged alternately on a XY plane in a substantially circular shape.

More specifically, in this embodiment, the positive pole 21a and the negative pole 21b of the first multi-pole 21 are arranged in the X-direction and the Y-direction, respectively, and the positive pole 22a and the negative pole 22b of the second multi-pole 22 are arranged in an X'-direction and a Y'-direction shifted from the X-direction and Y-direction by approximately 45 degrees respectively. Then, in the stigmator 16 by applying a voltage of a first voltage value between the positive pole 21a and the negative pole 21b of the first multi-pole 21 to form an electric field, so that correction of the cross-sectional shape of the ion beam I passing between the positive pole 21a and the negative pole 21b in the X-direction and the Y-direction of arrangement is achieved. Also, by applying a voltage of a second voltage value between the positive pole 22a and the negative pole 22b of the second multi-pole 22 to form an electric field, so that correction of the cross-sectional shape of the ion beam I passing between the positive pole 22a and the negative pole 22b in the X'-direction and the Y'-direction of arrangement is achieved. Then, the voltage value as an input value to be inputted to the charged particle optics is composed of the first voltage value to be applied to the first multi-pole 21 and the second voltage value to be applied to the second multi-pole 22. Also, the scanning electrode 17 is able to deflect the ion beam I passed therethrough by a predetermined amount in the X-direction and the Y-direction by applying a voltage by a scanning electrode control power source 23, whereby the target sample M and the standard sample N are scanned with the ion beam I, or the irradiation point can be shifted so that the predetermined position is irradiated therewith.

Figure 3:
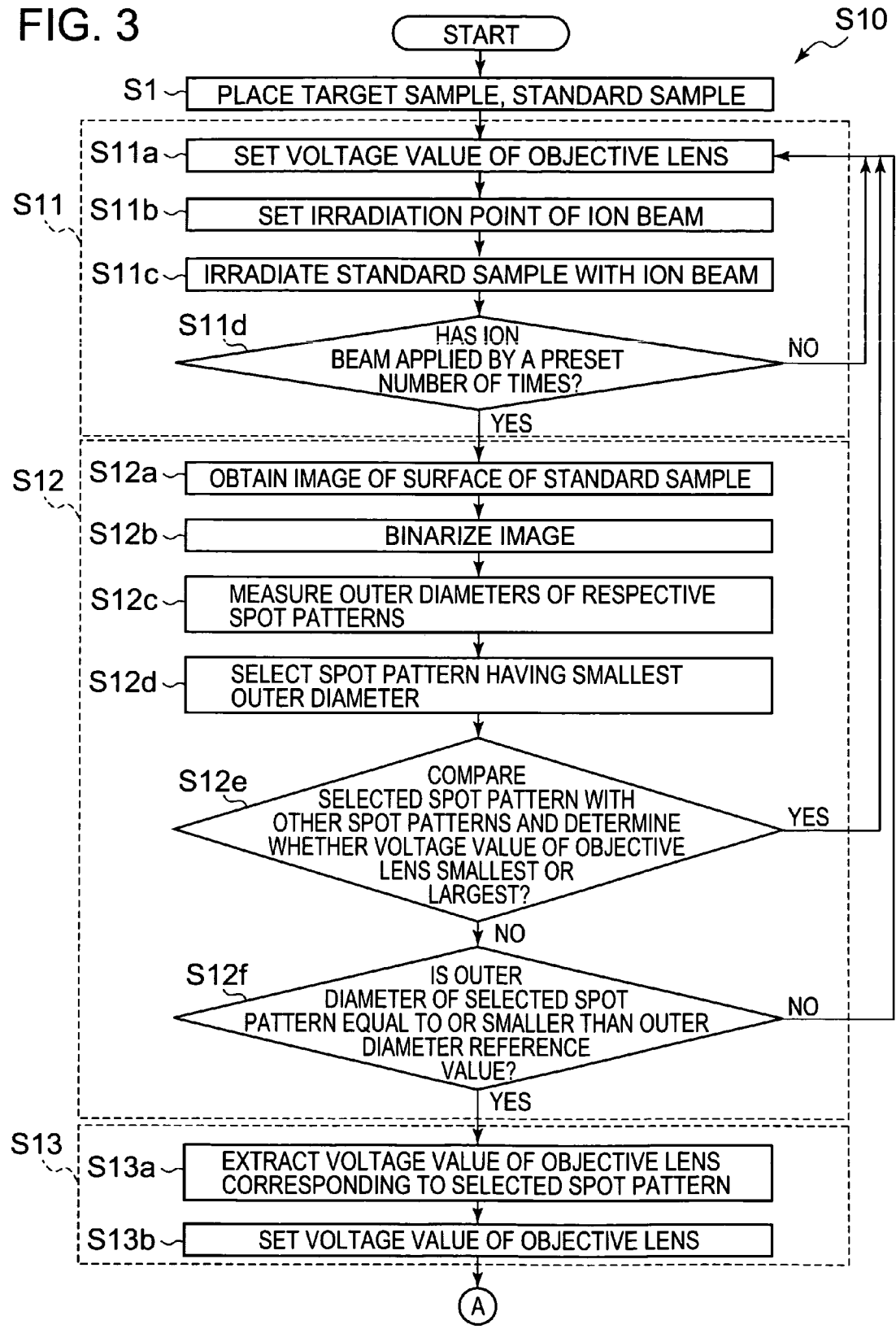
FIG. 3 is a flowchart of an objective lens adjusting step according to the first embodiment of the present invention.
Figure 4:
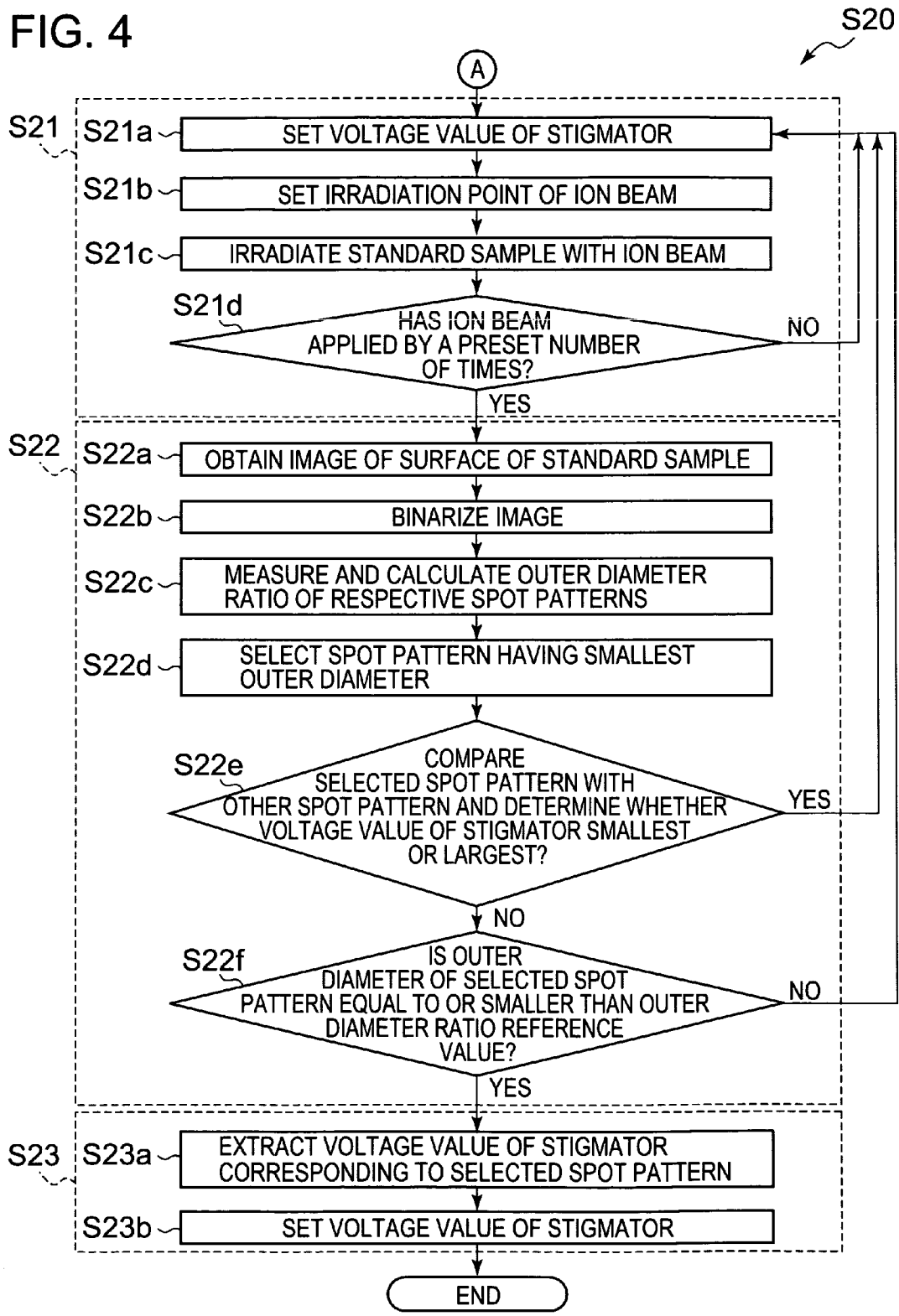
FIG. 4 is a flowchart of a stigmator adjusting step according to the first embodiment of the present invention.

Also, the five-axis stage 6, the ion source control power source 10, the condenser lens control power source 13, the objective lens control power source 14, the aperture drive unit 19, the stigmator control power source 20, and the scanning electrode control power source 23 described above are connected to a control unit 30. In addition, the focused ion beam apparatus 1 includes a secondary electronic detector 24 which is able to detect a secondary electron generated from the target sample M and the standard sample N when the target sample M and the standard sample N are irradiated with the ion beam I, so that the result of detection may be outputted to an image processing means 31 of the control unit 30. In the image processing means 31, the states of the surfaces of the target sample M and the standard sample N can be obtained as images from the result of detection, that is, the secondary electronic detector 24 and the image processing means 31 constitute observing means 32. The image data obtained by the observing means 32 may be monitored with a terminal 25. The control unit 30 includes spot pattern forming means 33 and spot pattern analyzing means 34 for performing the correction of the astigmatism of the ion beam I ejected from the ion source 9 and adjustment of the focal length automatically and irradiates the target sample M therewith, and also includes a storage unit 35 for storing various preset input values. Then, the control unit 30 controls the respective configurations to cause the ion beam I to be ejected at the predetermined acceleration voltage and current, and to irradiate the target sample M therewith while correcting the astigmatism and adjusting the focal length, so that processing and observation of the target sample M are achieved. It is also possible to irradiate the target sample M with the ion beam I by setting various conditions manually with the terminal 25 connected to the control unit 30. Referring now to flowcharts in FIG. 3 and FIG. 4, a procedure to correct the astigmatism by the stigmator 16 and adjust the focal length of the objective lens 12 and detailed actions of the respective configurations of the control unit 30 will be described.

First of all, as an adjustment preparation step S1, the target sample M and the standard sample N prepared in advance are placed on the sample base 2. The standard sample N must simply be a material on which irradiation marks referred to as spot patterns can be formed on the surface thereof by irradiating with the ion beam I. However, since it is intended to adjust the objective lens 12 and the stigmator 16, it preferably has a flat surface. If observation and the processing are not impaired even though the spot pattern is formed on the surface of the sample, the target sample M which is actually observed and processed may be used as the standard sample N.

Figure 5:
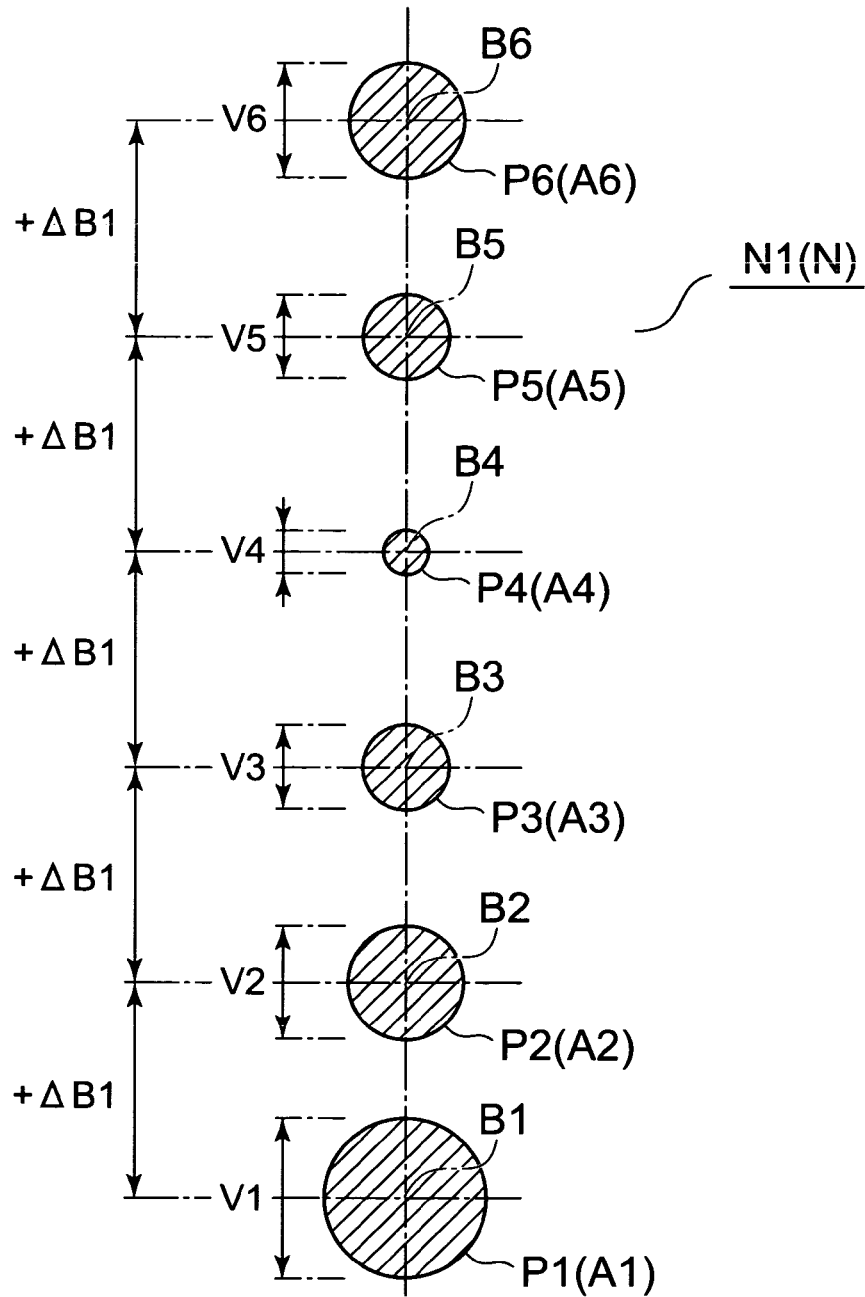
FIG. 5 is a plan view showing a first example of an image of a surface of a standard sample on which spot patterns are formed in the objective lens adjusting step according to the first embodiment of the present invention.

Then, adjustment of the focal length of the objective lens 12 is performed as an objective lens adjusting step S10. In other words, first, a surface N1 of the standard sample N is irradiated with the ion beam I at a plurality of points to form the plurality of spot patterns as a spot pattern forming step S11. First, the spot pattern forming means 33 of the control unit 30 sets a voltage value A1 of the objective lens 12 as an initial value (Step S11a) and sets an irradiation point B1 of the ion beam I to the standard sample N by the scanning electrode 17 (Step S11b). The voltage value A1 of the objective lens 12 and the coordinate information of the irradiation point B1 of the ion beam I set here are stored in the storage unit 35 in one to one correspondence. The voltage value to be applied to the stigmator 16 is also set to an initial value. Then, the surface N1 of the standard sample N is irradiated with the ion beam I for a certain period of time to form a spot pattern P1 as shown in FIG. 5 (Step S11c). Although the respective spot patterns are formed in substantially circular shapes for the clarity of description in FIG. 5, they may assume oval shapes in this stage where the adjustment of the stigmator 16 is not done yet. What should be done at least is to adjust the objective lens 12 while maintaining the voltage value of the stigmator 16 constant in the following steps. If the spot patterns P1 are formed at a preset number of positions by the spot pattern forming means 33 of the control unit 30, the procedure goes to the next step and, if not, the procedure goes back to Step S11a again. In this embodiment, the spot pattern forming means 33 of the control unit 30 is assumed to be set to form the spot pattern at six positions in total. Therefore, the procedure goes back to Step S11a determining that all the spot patterns are not yet formed.

In other words, the spot pattern forming means 33 of the control unit 30 resets the voltage value of the objective lens 12 to a voltage value A2 (Step S11a). Here, the voltage value A2 of the objective lens 12 is set to a value changed from the previous voltage value A1 by a preset amount of change $+\Delta A1$. Then, the irradiation point of the ion beam I is reset to an irradiation point B2 (Step S11b). Here, the irradiation point B2 of the ion beam I is determined as follows. That is, a value of $+\Delta B1 (=\alpha \times (+\Delta A1))$, which is the amount of change obtained by multiplying the amount of change $+\Delta A1$ of the voltage value by a preset coefficient $\alpha$, is obtained. Then, the position displaced by the amount of displacement $+\Delta B1$ in the X-direction with respect to the previous irradiation point B1 is set to the irradiation point B2 of this time. Then, the surface N1 of the standard sample N is irradiated with the ion beam I for a certain period of time to form a spot pattern P2 as shown in FIG. 5 (Step S11c). By repeating this procedure, the positions of application B1 to B6 are irradiated with the ion beam I at the voltage values A1 to A6 of the objective lens 12 to form spot patterns P1 to P6 at six positions in total. In this embodiment, the amount of change of the voltage value is determined to be constant at the amount of change $+\Delta A1$ and hence the amount of displacement of the irradiation point is also constant at the amount of displacement $+\Delta B1$. However, the amount of change of the voltage value may be varied.

Figure 6:
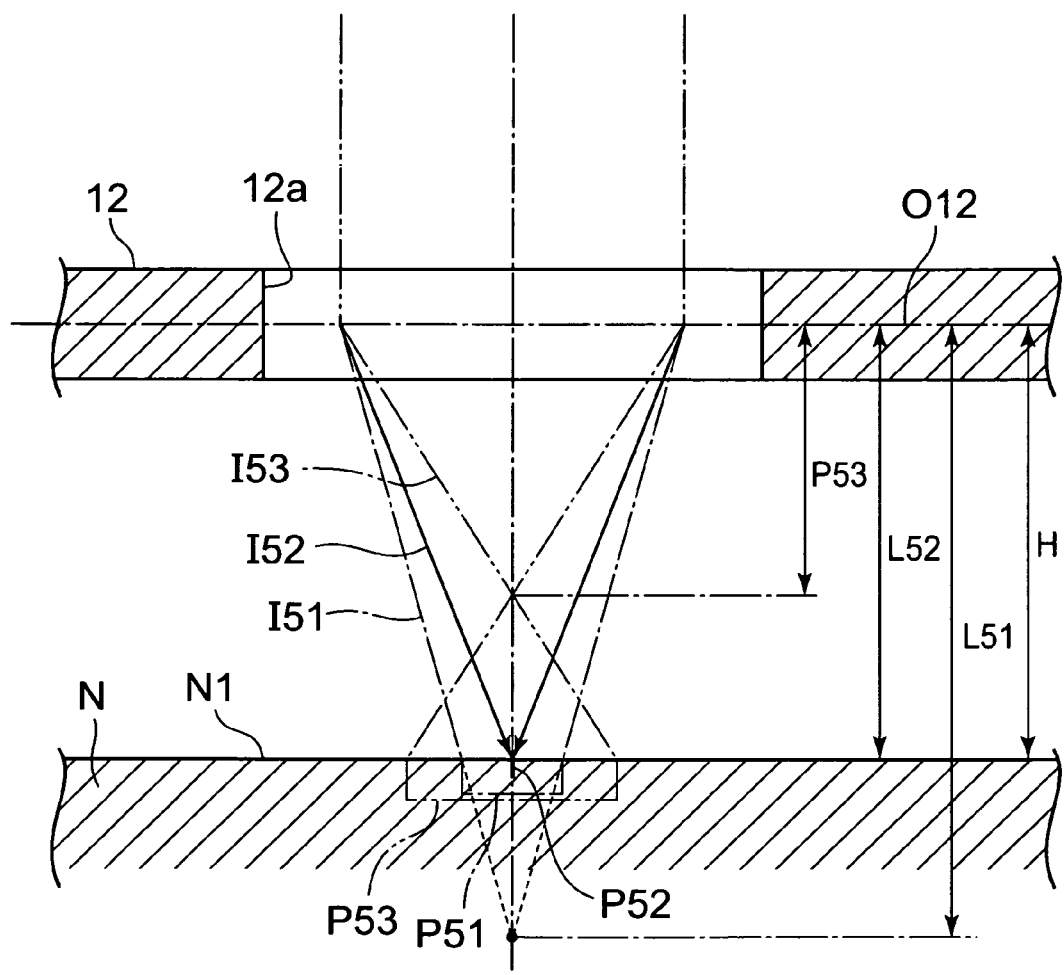
FIG. 6 is a principle drawing of spot patterns formed in a spot pattern forming step in the objective lens adjusting step according to the first embodiment of the present invention.

Here, when the voltage value of the objective lens 12 is gradually increased, the action of the electric field formed therein is increased, so that the focal length of the objective lens 12 is reduced. That is, the state of the focal point of the objective lens 12 is migrated from the state of over focus to the state of under focus due to the positional relation with respect to the surface N1 of the standard sample N. As shown in FIG. 6, in the state of the over focus, a focal length L51 of an ion beam I51 is larger than a separation distance H from a center O12 of the objective lens 12 to the surface N1 of the standard sample N. Therefore, the range of irradiation of the ion beam I51 is increased, so that the outer diameter of a spot pattern P51 formed thereby is also increased. In contrast, in the state of being in focus, a focal length L52 of an ion beam I52 is substantially equal to the separation distance H. Therefore, the range of irradiation of the ion beam I52 is decreased, so that the outer diameter of a spot pattern P52 formed thereby is also decreased. Also, in the state of being in under focus, a focal length L53 of an ion beam I52 is shorter than the separation distance H. Therefore, the range of irradiation of the ion beam I53 is increased again, to that the outer diameter of a spot pattern P53 formed thereby is also increased. In other words, as shown in FIG. 5, by changing the voltage value from the spot pattern P1 formed by the irradiation of the ion beam I at the voltage value A1, the outer diameter of the spot pattern is gradually decreased according to the voltage value, and then is increased again from a certain position.

Substantially, the plurality of spot patterns P1 to P6 formed in the spot pattern forming step S11 are analyzed as a spot pattern analyzing step S12. First of all, the image of the surface N1 of the standard sample N is obtained by the observing means 32 (Step S12a). In other words, the control unit 30 sets the acceleration voltage to a low value by the ion source control power source 10 to cause the ion source 9 to irradiate the ion beam I, and causes the scanning electrode 17 to scan the surface N1 of the standard sample N entirely. Then, secondary electrons ejected from the surface N1 of the standard sample N according to the irradiation are detected by the secondary electronic detector 24 of the observing means 32 in sequence, and the result is imaged by the image processing means 31, so that the image of the surface N1 of the standard sample N is obtained. Then, the spot pattern analyzing means 34 of the control unit 30 binarizes the obtained image to create binary data (Step S12b), whereby the image as shown in FIG. 5 is obtained.

Then, the spot pattern analyzing means 34 of the control unit 30 measures outer diameters V1 to V6 of the respective spot patterns P1 to P6 as the spot characteristic values which represent the shapes of the spot patterns from the obtained image (Step S12c). In this embodiment, the measurement of the outer diameter is commonly performed in the X-direction. In this case, since the image is binarized, outer edges of the spot patterns P1 to P6 are clearly recognized, so that further accurate measurement is achieved. Then, the spot pattern analyzing means 34 of the control unit 30 selects a spot pattern having the smallest value from among the measured outer diameters V1 to V6 (Step S12d). In the case of this embodiment, it is assumed that the outer diameter V4 of the spot pattern P4 has the smallest value, and the spot pattern analyzing means 34 of the control unit 30 selects the spot pattern P4. In the spot pattern forming step S11, the amount of displacement +ΔB1 which represents the distance between the positions of application is coordinated with the voltage value by the coefficient a in the Step S11b, whereby the spot patterns are formed. Therefore, the spot pattern having the smallest outer diameter is easily selected from the shapes and the state of arrangement of the spot patterns P1 to P6 without depending on detailed measurement.

Subsequently, the spot pattern analyzing means 34 of the control unit 30 reads out the voltage values A1 to A6 of the objective lens 12 set when the respective spot patterns P1 to P6 are formed from the storage unit 35. Then, whether the voltage value A4 corresponding to the selected spot pattern P4 is smallest or largest is determined in comparison with the voltage values A1 to A3, A5, A6 corresponding to the other spot patterns P1 to P3, P5, P6 (Step S12e). In this embodiment, since the voltage value A4 corresponding to the selected spot pattern P4 is larger than the voltage values A1 to A3 and smaller than the voltage values A5, A6, the procedure goes to the next step. Subsequently, whether the outer diameter V4 of the selected spot pattern P4 is not larger than an outer diameter reference value V0 which is a preset spot reference value or not is determined (Step S12f). Here, the outer diameter V4 of the selected spot pattern P4 is assumed to be smaller than the outer diameter reference value V0, and the procedure goes to the next step, that is, an input value setting step S13.

In the input value setting step S13, the control unit 30 extracts the voltage value A4 of the objective lens 12 corresponding to the spot pattern P4 selected in the spot pattern analyzing step S12 again from the storage unit 35. Then, the control unit 30 sets the voltage value of the objective lens 12 to the extracted voltage value A4. Here, when the focal length of the objective lens 12 and the separation distance H between the objective lens 12 and the surface N1 of the standard sample N are substantially the same as described above, and hence being in focus, the outer diameter of the spot pattern is small. Therefore, by selecting the spot pattern P4 having the smallest outer diameter and setting the same to the corresponding voltage value A4, the focal length of the objective lens 12 as the beam characteristic value is adjusted to the separation distance H between the objective lens 12 and the surface N1 of the standard sample N, whereby focusing is obtained.

Figure 7:
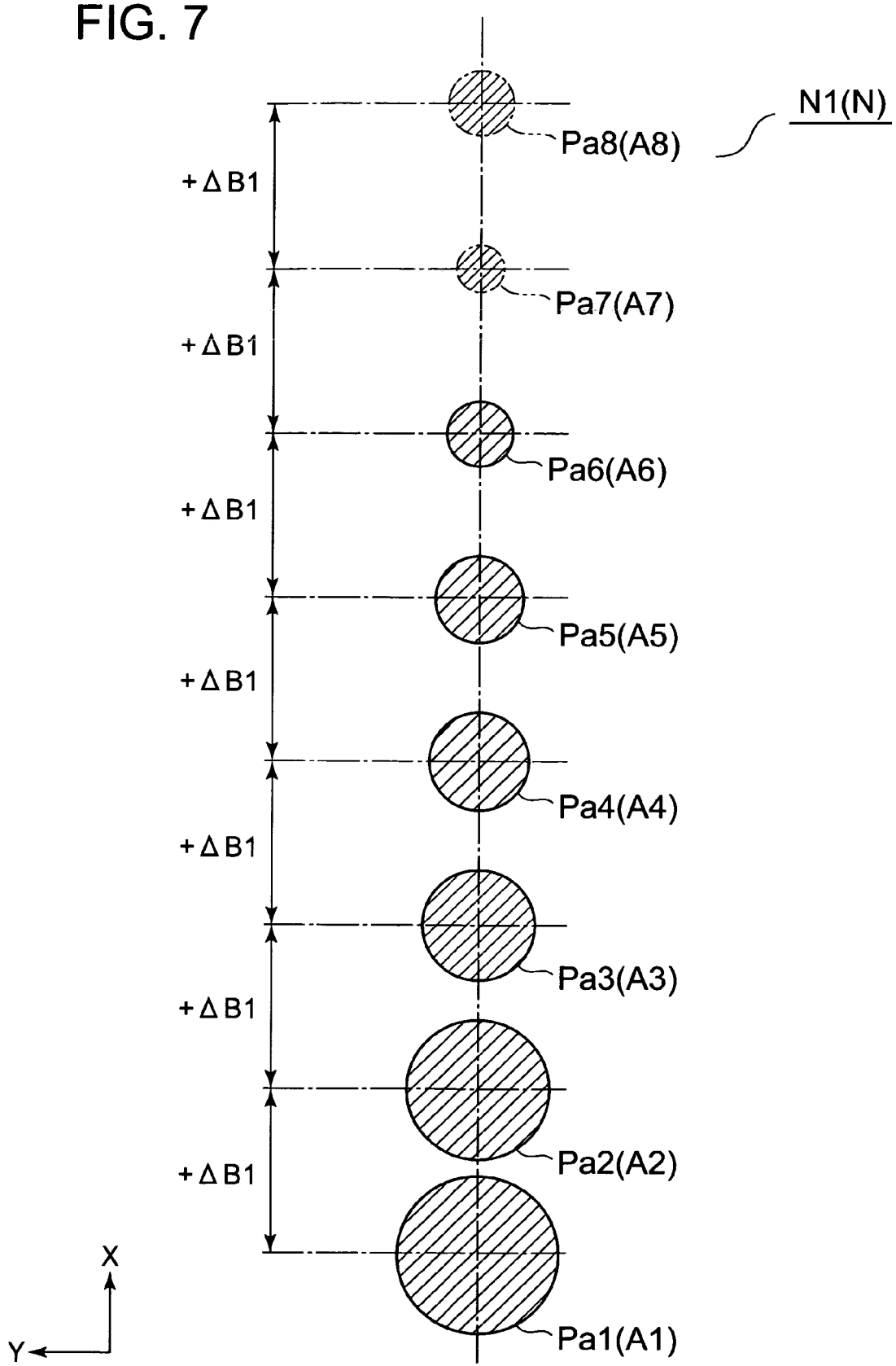
FIG. 7 is a plan view showing a second example of an image of a surface of a standard sample on which spot patterns are formed in the objective lens adjusting step according to the first embodiment of the present invention.

Incidentally, in the Step S12e of the spot pattern analyzing step S12, the voltage value corresponding to the selected spot pattern might be the smallest or the largest in comparison with the voltage values corresponding to the other spot patterns. In other words, for example, it is assumed that the voltage value is changed from the voltage values A1 to A6 to form spot patterns Pa1 to Pa6 as shown in FIG. 7, and the spot pattern Pa6 is selected as the one having the smallest outer diameter. The voltage value A6 of the objective lens 12 corresponding to the spot pattern Pa6 is the largest in comparison with the other voltage values A1 to A5. Therefore, a spot pattern having a smaller outer diameter might be formed at a voltage value larger than the voltage value A6. Therefore, the spot pattern analyzing means 34 of the control unit 30 causes the spot pattern forming step S11 to be performed again. Then, in this case, the spot pattern forming means 33 of the control unit 30 changes the voltage value within a range including voltage values larger than the voltage value A6 corresponding to the spot pattern Pa6 selected in the spot pattern analyzing step S12 to form spot patterns. For example, it is assumed that spot patterns Pa7, Pa8 are formed at a voltage value A7 which is larger than the voltage value A6 by the amount of change +ΔA1 and a voltage value A8 which is further larger than that by the amount of change +ΔA1 respectively in the range larger than the voltage value A6. Since the positions of application are the same as described above, the description will be omitted. In this configuration, the spot pattern Pa7 having an outer diameter smaller than the spot pattern Pa6 which is selected first can be selected in the spot pattern analyzing step S12 again, and by setting the voltage value of the objective lens 12 to the voltage value A7 corresponding to the spot pattern Pa7, the focal length is adjusted to a length substantially the same as the separation distance H with a higher degree of accuracy. If the voltage value corresponding to the selected spot pattern is the smallest in comparison with the voltage values corresponding to the other spot patterns in the Step S12e of the spot pattern analyzing step S12, the voltage value may be changed within the range smaller than the voltage value corresponding to the selected spot pattern.

Figure 8:
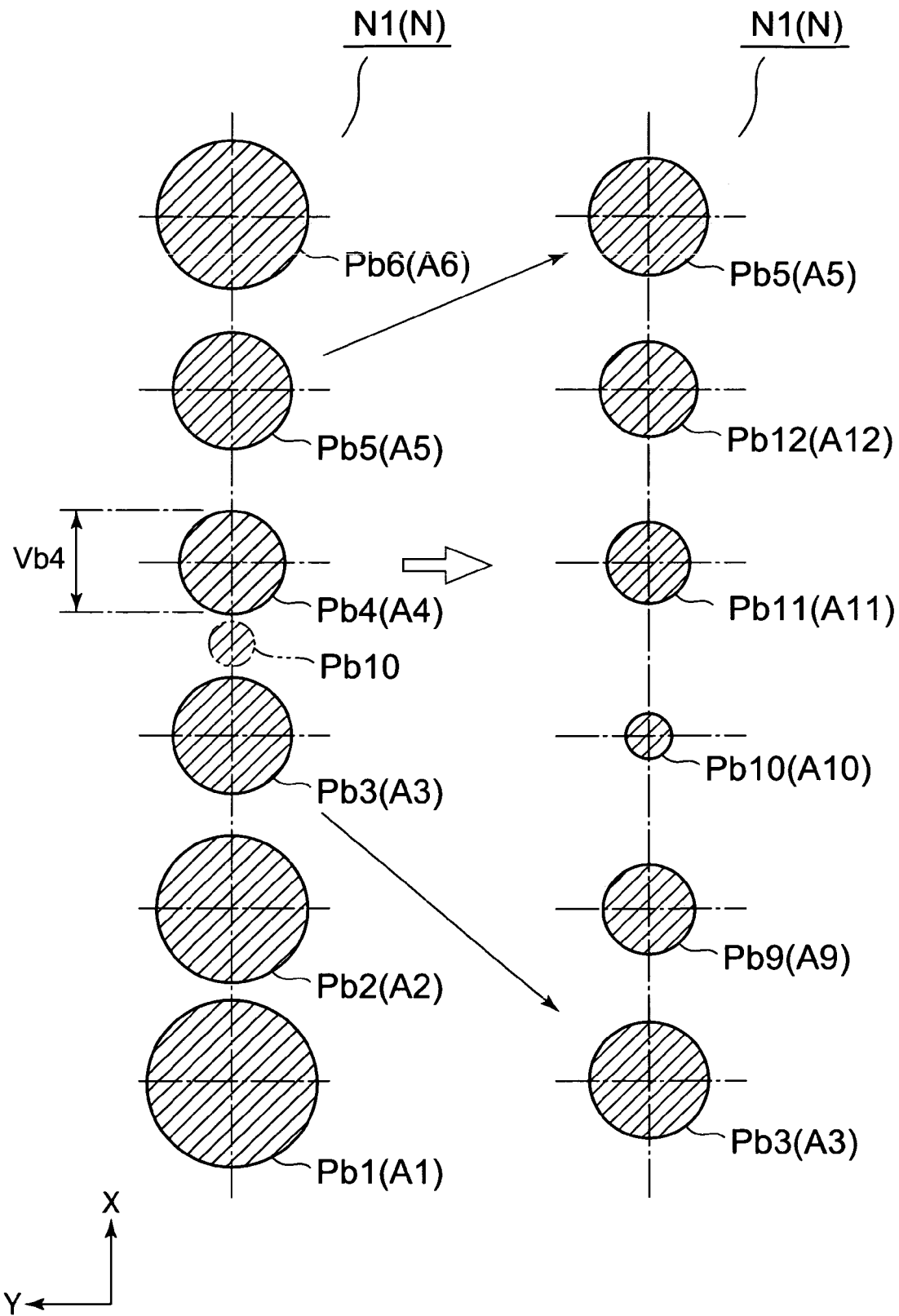
FIG. 8 is a plan view showing a third example of an image of a surface of a standard sample on which spot patterns are formed in the objective lens adjusting step according to the first embodiment of the present invention.

Also, in the Step S12f of the spot pattern analyzing step S12, there may be a case where the outer diameter of the selected spot pattern is larger than the preset outer diameter reference value V0. In other words, as shown in FIG. 8(a) for example, it is assumed that the voltage value is changed from the voltage values A1 to A6 and spot patterns Pb1 to Pb6 are formed. Then, it is assumed that the spot pattern Pb4 formed with the voltage value A4 as the voltage value of the objective lens 12 is selected as the one having the smallest outer diameter and a corresponding outer diameter Vb4 is larger than the outer diameter reference value V0. In this case, there might exist a voltage value whose amount of change +ΔA1 of the voltage value set by the spot pattern forming means 33 is large and which achieves the smaller outer diameters as an intermediate value. Therefore, the spot pattern analyzing means 34 of the control unit 30 causes the spot pattern forming step S11 to be performed again. Then, in this case, the spot pattern forming means 33 of the control unit 30 resets the currently set amount of change +ΔA1 to an amount of change +ΔA2 which is smaller than that. Then, the voltage value is changed by the amount of change +ΔA2 within a range including the range before and after the voltage value A4 corresponding to the spot pattern Pb4 selected in the spot pattern analyzing step S12, that is, within the range from the voltage values A3 to A5, and the spot patterns Pb3, Pb9 to P11, and P5 are formed at the voltage values A3, A9 to A12, A5. Accordingly, a spot pattern Pb10 whose outer diameter is not larger than the outer diameter reference value V0 may be selected, so that the voltage value of the objective lens 12 can be adjusted to a voltage value A10 so that the focal length becomes substantially the same as the separation distance with a higher degree of accuracy. By changing the setting of the coefficient α in the Step S11c, even when the amount of change of the voltage value is reduced from the amount of change +ΔA1 to the amount of change +ΔA2, the spot patterns can be formed clearly without being overlapped with each other.

Accordingly, when the adjustment of the focal length of the ion beam I by the objective lens 12 is ended, then the correction of the astigmatism of the ion beam I by the stigmator 16 is performed as a stigmator adjusting step S20. In other words, first, the surface N1 of the standard sample N is irradiated with the ion beam I at a plurality of points within a range different from that in the objective lens adjusting step S10 to form the plurality of spot patterns as a spot pattern forming step S21. It is further preferable to perform the following steps with the voltage value of the objective lens 12 constant at a value larger or smaller than the voltage value set in the objective lens adjusting step S10. Accordingly, the ion beam I is brought into a state of over focus or under focus, and hence a large spot pattern is formed, so that the identification of the large spot patterns in a spot pattern analyzing step S22 descried later is achieved easily.

Figure 9:
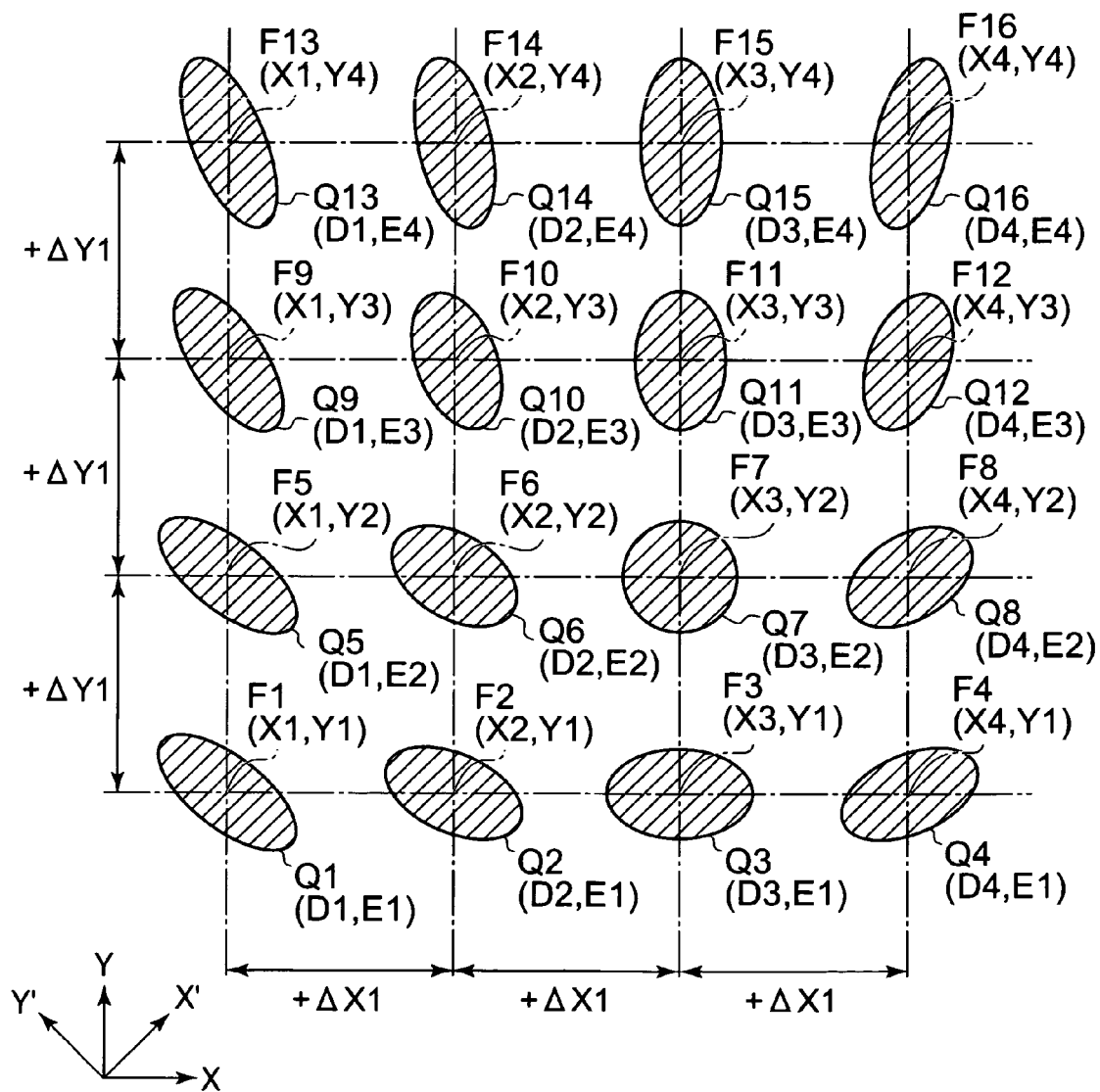
FIG. 9 is a plan view showing an example of an image of a surface of a standard sample on which spot patterns are formed in the stigmator adjusting step according to the first embodiment of the present invention.

The spot pattern forming means 33 of the control unit 30 sets a voltage value C1 of the stigmator 16 as an initial value (Step S21a). Here, the voltage value C1 includes a first voltage value D1 to be applied between a positive pole 219a and a negative pole 21b of the first multi-pole 21 and a second voltage value E1 to be applied between a positive pole 22a and a negative pole 22b of the second multi-pole 22, and is expressed as the voltage value C1 (D1, E1) hereinafter. Subsequently, an irradiation point F1 of the ion beam I on the standard sample N is set by the scanning electrode 17 (Step S21b). The irradiation point F1 here includes an X coordinate X1 which represents the position in the X-direction and a Y coordinate Y1 representing the position in the Y-direction, and is expressed by the irradiation point F1 (X1, Y1) hereinafter. Then, the surface N1 of the standard sample N is irradiated with the ion beam I for a certain period of time to form a spot pattern Q1 as shown in FIG. 9 (Step S21c). Here, the shape of the spot pattern Q1 is deformed in the X-direction and the Y-direction according to the first voltage value D1, and assumes an oval shape deformed in the X'-direction and the Y'-direction shifted from the X-direction and Y-direction by 45 degrees according to the second voltage value E1. If the spot patterns are formed at a preset number of positions by the spot pattern forming means 33 of the control unit 30, the procedure goes to the next step and, if not, the procedure goes back to Step S21a again (Step S21d). In this embodiment, the spot pattern forming means 33 of the control unit 30 is assumed to be set to form the spot pattern at sixteen positions in total. Therefore, the procedure goes back to Step S21a determining that all the spot patterns are not yet formed.

In other words, the spot pattern forming means 33 of the control unit 30 resets the voltage value of the stigmator 16 to a voltage value C2 (D1, E2) (Step S21a). Here, assuming that the amount of change of the voltage value of the stigmator 16 is +ΔC1, a first amount of change +ΔD1 for the first voltage value and a second amount of change +ΔE1 for the second voltage value are set in advance. Although the first voltage value and the second voltage value may be changed simultaneously as the voltage value of the stigmator 16 on the basis of the preset amount of change, sixteen different sets of voltage values C1 to C16 are composed by combining four each of values of first voltage values D1 to D4 at the first amount of change +ΔD1 and second voltage values E1 to E4 at the second amount of change +ΔE1, respectively, in this embodiment for the sake of clarity.

Then, the irradiation point of the ion beam I is reset to an irradiation point F2 (X2, Y1) (Step S21b). The irradiation point of the ion beam I here is set to a position displaced by an amount of displacement obtained by multiplying the amount of change of the voltage value by a predetermined coefficient β. In other words, a first amount of displacement +ΔX1 (=β× (+ΔD1)) corresponding to the first amount of change +ΔD1 is obtained. Also, a second amount of displacement +ΔY1 (=β× (+ΔE1)) corresponding to the second amount of change +ΔE1 is obtained. Then, sixteen different sets of irradiating points F1 to F16 are composed by combining four each of values of X coordinates X1 to X4, and Y coordinates Y1 to Y4 corresponding to the first voltage value and the second voltage value. An operation to irradiate the surface N1 of the standard sample N with the ion beam I for a certain period of time is repeated at the positions of application F1 to F16 corresponding to the voltage values C1 to C16, so that the sixteen corresponding spot patterns Q1 to Q16 are formed in total (Step S21c) as shown in FIG. 9. Then, these spot patterns Q1 to Q6 assume a substantially circular shape or a oval shape elongated in either direction according to the corresponding voltage values C1 to C16 (D1 to D4, E1 to E4).

Substantially, the plurality of spot patterns Q1 to Q16 formed in the spot pattern forming step S21 are analyzed as the spot pattern analyzing step S22. First of all, an image of the surface N1 of the standard sample N is obtained by the observing means 32 (step S22a), and the image is binarized by the spot pattern analyzing means 34 of the control unit 30 (Step S22b), so that the image as shown in FIG. 9 is obtained.

Then, the spot pattern analyzing means 34 of the control unit 30 measures the smallest outer diameter (short diameter) and the largest outer diameter (long diameter) of the respective spot patterns Q1 to Q16 from the obtained image as the spot characteristic values representing the shapes of the spot patterns, and calculates ratios of the long diameter with respect to the short diameter (hereinafter referred to as outer diameter ratios) W1 to W16 (Step S22c). Then, the spot pattern analyzing means 34 of the control unit 30 selects a spot pattern which has the smallest outer diameter ratio, that is, which assumes the most circular shape (Step S22d). In the case of this embodiment, it is assumed that the outer diameter ratio W7 of the spot pattern Q7 has the smallest value, and the spot pattern analyzing means 34 of the control unit 30 selects the spot pattern Q7. In the spot pattern forming step S21, an amount of change +ΔF1 which represents the distance between the positions of application is coordinated with the voltage value by the coefficient β in the Step S21b, whereby the spot patterns are formed. Therefore, the spot pattern having the smallest outer diameter ratio and assuming the substantially oval shape is easily selected from the shapes and the state of arrangement of the spot patterns Q1 to Q6 without depending on detailed measurement.

Subsequently, the spot pattern analyzing means 34 of the control unit 30 extracts the voltage values C1 to C16 of the stigmator 16 set when the respective spot patterns Q1 to Q16 are formed from the storage unit 35. Then, whether the first voltage value D3 and the second voltage value E2 which constitute the voltage value C7 corresponding to the selected spot pattern Q7 are respectively the smallest or the largest is determined in comparison with the first voltage values D1 to D4 and the second voltage values E1 to E4 corresponding to the other spot patterns Q1 to Q6, Q8 to Q16 (Step S22e) respectively. In this embodiment, at the voltage value C7 corresponding to the selected spot pattern Q7, the first voltage value D3 is larger than other first voltage values D1, D2 and smaller than the first voltage value D4, and the second voltage value E2 is larger than another second voltage value E1 and smaller than the second voltage values E3, E4. Therefore, the procedure goes to the next step. Subsequently, whether the outer diameter ratio W7 of the selected spot pattern Q7 is not larger than an outer diameter ratio reference value W0 which is a preset spot reference value or not is determined (Step S22f). Here, the outer diameter ratio W7 of the selected spot pattern Q7 is assumed to be smaller than the outer diameter ratio reference value W0, and the procedure goes to the next step, that is, an input value setting step S23.

In the input value setting step S23, the control unit 30 extracts the voltage value C7 (D3, E2) of the stigmator 16 corresponding to the spot pattern Q7 selected in the spot pattern analyzing step S22 again from the storage unit 35 (Step S23a). Then, the control unit 30 sets the first voltage value of the first multi-pole 21 and the second voltage value of the second multi-pole of the stigmator 16 as the extracted voltage value C7 (Step S23b). Here, when the beam diameter ratio of the ion beam I in two orthogonal directions is substantially equal to 1 and the cross-sectional shape assumes a substantially circular shape, the outer diameter ratio of the spot pattern is also reduced. Therefore, by selecting the spot pattern Q7 having the smallest outer diameter ratio and setting the same to the corresponding voltage value C7, the beam diameter of the ion beam I as the beam characteristic value is adjusted to be substantially equal to 1, that is, so as to be the substantially circular shape, whereby the astigmatism is corrected.

Incidentally, in the Step S22e of the spot pattern analyzing step S22, the first voltage value or the second voltage value which constitutes a voltage value corresponding to the selected spot pattern might be the smallest or the largest in comparison with the first voltage value or the second voltage value which constitutes a voltage value corresponding to the other spot patterns. In this case as well, the same procedure as the Step S11a of the spot pattern forming step S11 in the objective lens adjusting step S10 may be performed. In other words, if the one or both of the first voltage value or the second voltage value is the smallest, the first voltage value or the second voltage value may be changed within a range including a value smaller than the corresponding first voltage value or the second voltage value. Also, also, if it is the largest, the first voltage value or the second voltage value may be changed within a range including a value larger than the corresponding first voltage value or the second voltage value. Accordingly, the ion beam I having the beam diameter ratio substantially equal to 1 and having a substantially circular cross-sectional shape may be adjusted so as to be irradiated with a higher degree of accuracy on the basis of the outer diameter ratio of the formed spot pattern.

Also, in the Step S22f of the spot pattern analyzing step S22, there may be a case where the outer diameter ratio of the selected spot pattern is larger than the preset outer diameter ratio reference value W0. In this case as well, the same procedure as the Step S11a of the spot pattern forming step S11 in the objective lens adjusting step S10 may be performed. In other words, the currently set amount of change +ΔC1 (+ΔD1, +ΔE1) is reset to an amount of change +ΔC2 (+ΔD2, +ΔE2) which is smaller than that. Then, the voltage value may be changed on the basis of the above-described amount of change within a range including respective values before and after the first voltage value and the second voltage value corresponding to the spot patterns selected in the spot pattern analyzing step S22. Accordingly, the ion beam I having the beam diameter ratio substantially equal to 1 and having a substantially circular cross-sectional shape may be adjusted so as to be irradiated with a higher degree of accuracy on the basis of the outer diameter ratio of the formed spot pattern. Finally, as a processing and observation preparing step, the control unit 30 drives the five-axis stage 6 provided on the sample base 2 to adjust the position of the target sample M on the XY plane, so that the target sample M is moved to the irradiation point of the ion beam I, whereby the processing or the observation of the same by the ion beam I is enabled.

As described above, in the focused ion beam apparatus 1 in this embodiment, since the control unit 30 includes the spot pattern forming means 33 and the spot pattern analyzing means 34, the respective voltage values of the objective lens 12 and the stigmator 16 may be adjusted so that the focusing length of the ion beam I and the beam diameter ratio become desired values automatically, and easily in a short time with a high degree of accuracy only by forming the plurality of spot patterns on the sample both for the objective lens 12 and the stigmator 16 respectively. Although the control unit 30 is described to perform automatically in this embodiment, the adjustments of the objective lens 12 and the stigmator 16 are achieved with a high degree of accuracy easily in a short time according to the procedure described above even it is performed manually. Also, as regards the adjustment of the objective lens 12 and the stigmator 16 in this embodiment, the adjustment of the objective lens 12 is performed at the beginning. However, the present invention is not limited thereto. In addition, a configuration in which the adjustment is repeated after having completed a series of steps relating to the adjustment of the objective lens 12 and the stigmator 16 is also applicable. In this configuration, the formed spot pattern assumes a substantially circular shape by adjusting the stigmator 16 after having adjusted the objective lens 12 for example, and by adjusting the objective lens 12 again in this state, the focusing with a higher degree of accuracy is achieved. In this embodiment, since at least two samples, that is, the target sample M and the standard sample N can be arranged on the sample base 2, it is not necessary to release the vacuum chamber 4 and replace the sample after having adjusted the charged particle optic, so that the target sample M can be moved quickly to the irradiation point of the ion beam I for the processing and the observation of the target sample M.

Also, in this embodiment, although the stigmator 16 includes the first multi-pole and the second multi-pole each having four poles as the positive pole and the negative pole, the present invention is not limited thereto. For example, a configuration having only the first multi-pole is also applicable. Alternatively, even in a configuration having more than four poles such as six poles, eight pole, ten poles and so forth as the configuration of the electrodes of the first multi-pole and the second multi-pole, the adjustment is achieved in the same method. In addition, in a configuration in which the plurality of sets of the multi-poles are arranged in the Z-direction, the same method can be applied.

Figure 10:
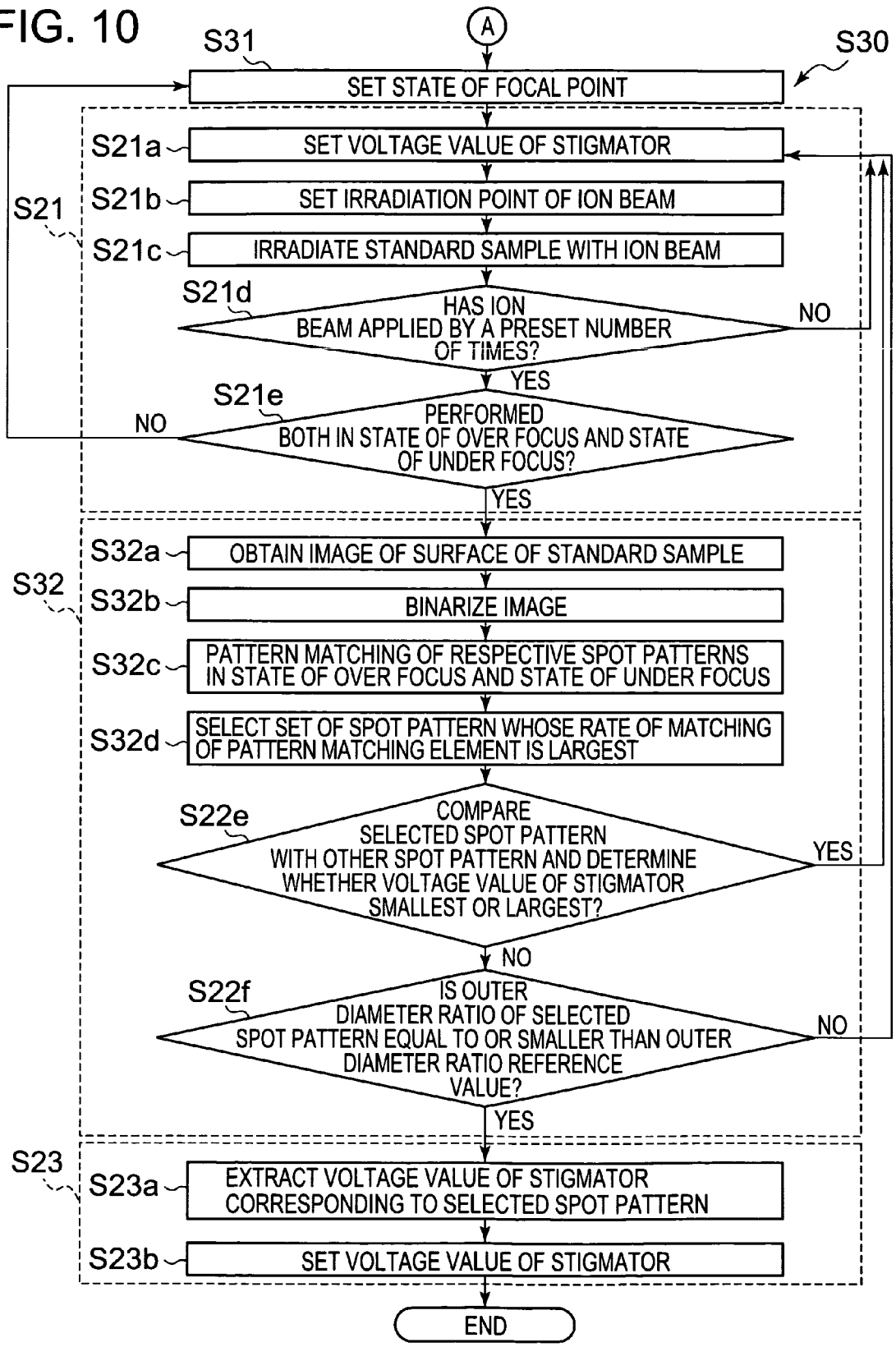
FIG. 10 is a flowchart of the stigma adjusting step in a modification of the first embodiment of the present invention.
Figure 11:
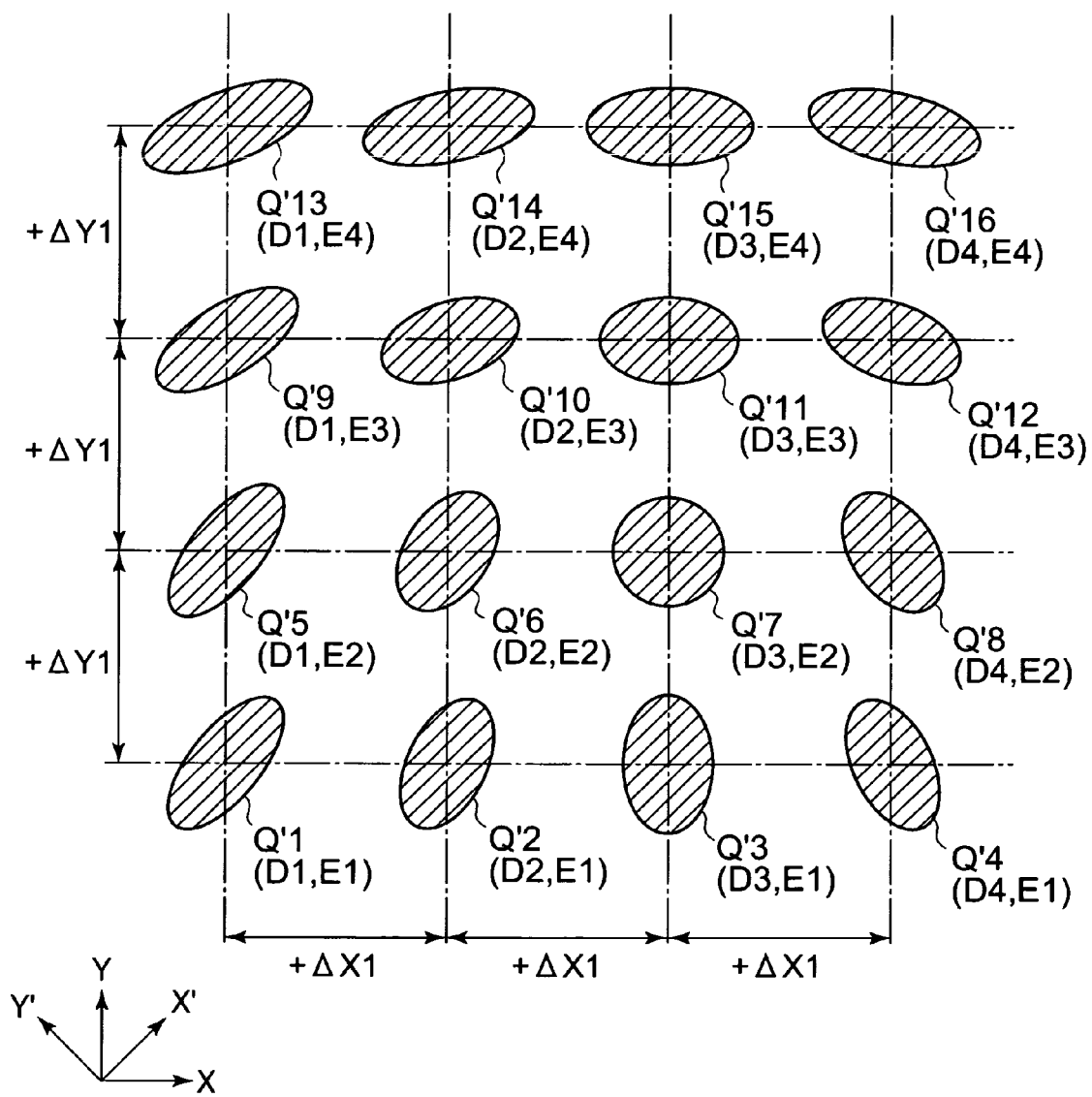
FIG. 11 is a plan view showing an example of an image of a surface of a standard sample on which spot patterns are formed in a second step in the stigmator adjusting step according to the modification of the first embodiment of the present invention.

FIG. 9 to FIG. 11 show modifications of the stigmator adjusting step in this embodiment. As shown in FIG. 10, in the stigmator adjusting step S30 in this modification, the focal point of the objective lens 12 is brought to a state of over focus as a preparation step S31. Then, the spot pattern forming step S21 (first step) is performed. Details of the spot pattern forming step S21 are the same as described above, that is, as shown in FIG. 9, the plurality of spot patterns Q1 to Q16 are formed on the surface N1 of the standard sample N. Then, whether this step is performed both in the state of over focus and in the state of under focus or not is determined (Step S21e). Since the step is not performed in the state of under focus, the procedure goes to the preparation step S31 again, where the state of the focal point of the objective lens 12 is changed from the state of the over focus to the state of the under focus. Then, the spot pattern forming step S21 (second step) is performed again. In this case, as shown in FIG. 11, the conditions of the voltage values C1 to C16 of the stigmator 16 are matched and spot patterns Q'1 to Q'16 are formed in the same arrangement. Then, since the spot patterns are formed both in the state of the over focus and in the state of the under focus, the procedure goes to the next step (Step S21e).

Substantially, the plurality of spot patterns Q1 to Q16 and the spot patterns Q'1 to Q'16 formed in the first step and the second step of the spot pattern forming step S21 are analyzed as a spot pattern analyzing step S32. First of all, an image including the spot patterns Q1 to Q16 in the first step as a group and an image including the spot patterns Q'1 to Q'16 in the second step as a group are obtained respectively on the surface N1 of the standard sample N by the observing means 32 (Step S32a), and the images are binarized by the spot pattern analyzing means 34 of the control unit 30 (Step S32b), so that the images shown in FIG. 9 and FIG. 11 are obtained.

Then, pattern matching of the spot patterns Q1 to Q16 in the first step and the spot patterns Q'1 to Q'16 in the second step having the same voltage value is performed (Step S32c).

Then, the set of the spot patterns which achieves the highest ratio of matching of the pattern matching elements is selected (Step S32d). Here, when the spot patterns Q'1 to Q'16 in the second step are compared with the corresponding spot patterns Q1 to Q16 in the first step respectively, they assume the substantially same shapes since the respective voltage values are the same C1 to C16. In contrast, since the state of the focal point is different between the over focus and the under focus, the directions of the charged particle beams are different by approximately 90 degrees, that is, the directions of the respective spot patterns are different by approximately 90 degrees. Therefore, the ratio of matching of the pattern matching elements is low among the spot patterns assuming the oval shape, the ratio of matching of the pattern matching elements is high among the substantially circular spot patterns. Therefore, by selecting the set of the spot pattern having the highest ratio of matching of the pattern matching elements, the set of the spot patterns Q7, Q'7 being almost a circle, that is, having the outer diameter ratio W as the spot characteristic value is substantially equal to 1, and having the smallest value may be selected. Here, the spot patterns Q1 to Q16 and the spot patterns Q'1 to Q16 have the same conditions of the voltage values C1 to C16, and are arranged in the same arrangement, the pattern matching of the images relating to the spot patterns Q1 to Q16 and of the images relating to the spot patterns Q'1 to Q'16 are achieved at once. Therefore, selection of the set of the spot patterns Q7, Q'7 having the smallest outer diameter ratio is achieved more effectively and easily. Then, by setting the voltage value of the stigmator 16 to the voltage value C7 corresponding to the spot patterns Q7, Q'7 selected in the input value setting step S23, the ion beam I having the beam diameter ratio substantially equal to 1 and having a substantially circular cross-sectional shape can be adjusted so as to allow irradiation.

(Second Embodiment)

Figure 12:
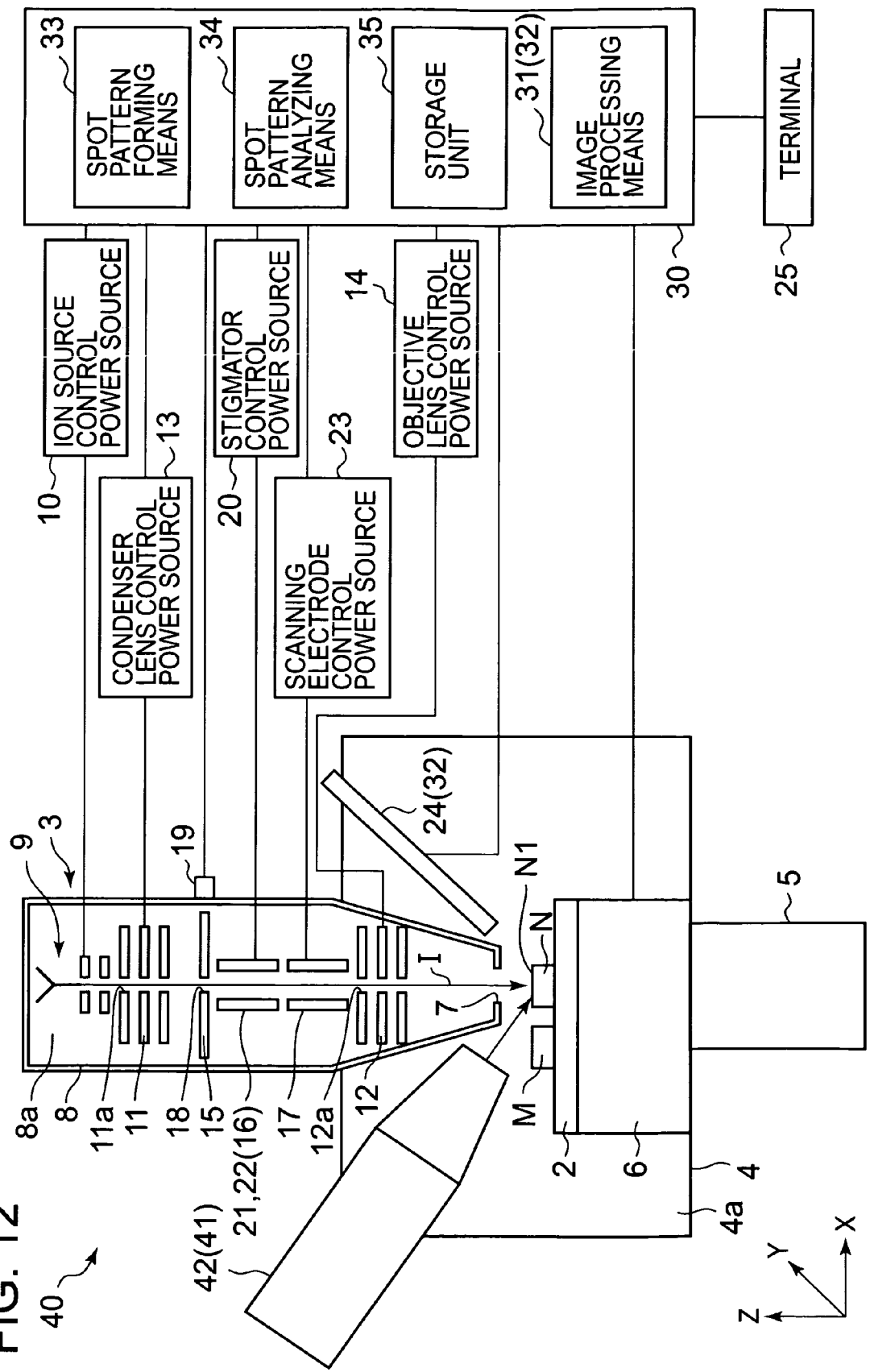
FIG. 12 is a configuration drawing of a charged particle beam apparatus according to a second embodiment of the present invention.

FIG. 12 shows a second embodiment of the present invention. In this embodiment, common members as the members used in the embodiment described above are designated by the same reference numerals, and description will be omitted.

As shown in FIG. 12, a focused ion beam apparatus 40 in this embodiment includes a SEM column 42 as an observing means 41. Then, by using the SEM column 42 and the secondary electronic detector 24 as means for obtaining the image used in the spot pattern analyzing steps S12, S22, adjustment of the objective lens 12 and the stigmator 16 as the charged particle optics is achieved on the basis of the image with a higher degree of accuracy. In this case, the five-axis stage 6 is tilted and the target sample M or the standard sample N is arranged so that the surface of the target sample M or the standard sample N becomes substantially vertical to the center axis of the SEM column 42. It is also possible to perform the adjustment of the objective lens and the stigmator, not shown, as the charged particle optics by the SEM column 42 as well instead of the ion beam column 3. Here, in the SEM column 42, the objective lens includes a coil, and the electron beam is focused by the action of the magnetic field formed by the coil. Therefore, the current value of the coil of the objective lens is set as an input value to adjust the focal length. In the same manner, in the stigmator as well, by setting the current value of the coil included therein, the strength of the magnetic field which acts thereon is changed, and the beam diameter ratio is adjusted.

(Third Embodiment)

Figure 13:
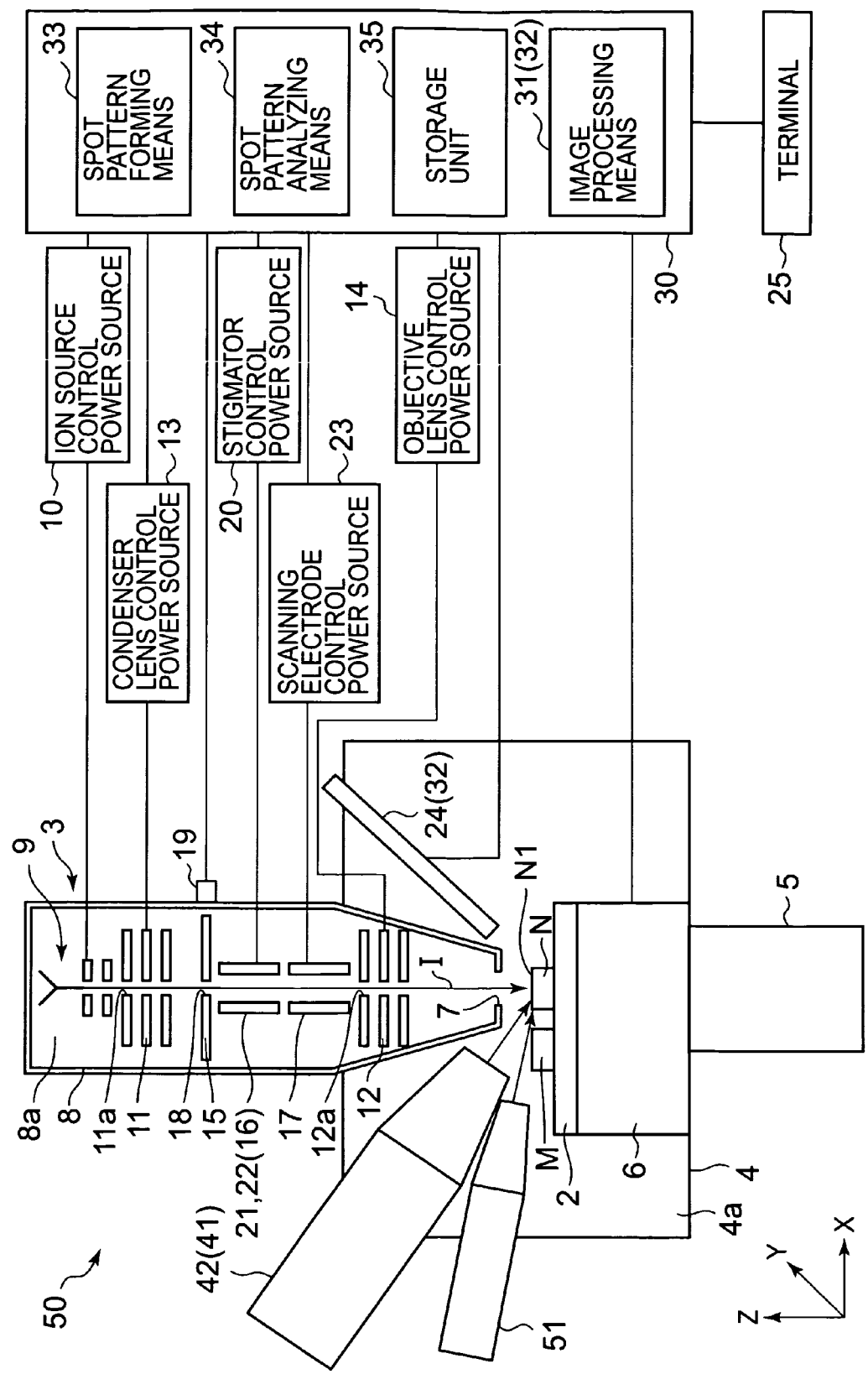
FIG. 13 is a configuration drawing of a charged particle beam apparatus according to a third embodiment of the present invention.

FIG. 13 shows a third embodiment of the present invention. In this embodiment, common members as the members described above are designated by the same reference numerals, and description will be omitted.

As shown in FIG. 13, a focused ion beam apparatus 50 in this embodiment further includes a rare gas ion beam column 51. The rare gas ion beam column 51 is able to irradiate with rare gas ion such as argon ion as an ion beam at a low speed, and is able to process the sample without giving damage thereto, which is used preferably for the finish machining using in the normal processing with the ion beam. With such the focused ion beam apparatus 50, the adjustment of the objective lens or the stigmator, not shown, is achieved as the charged particle optics not only as the ion beam ion beam column 3, but also as the SEM column 42 or the rare gas ion beam column 51 in the same manner.

(Fourth Embodiment)

Figure 14:
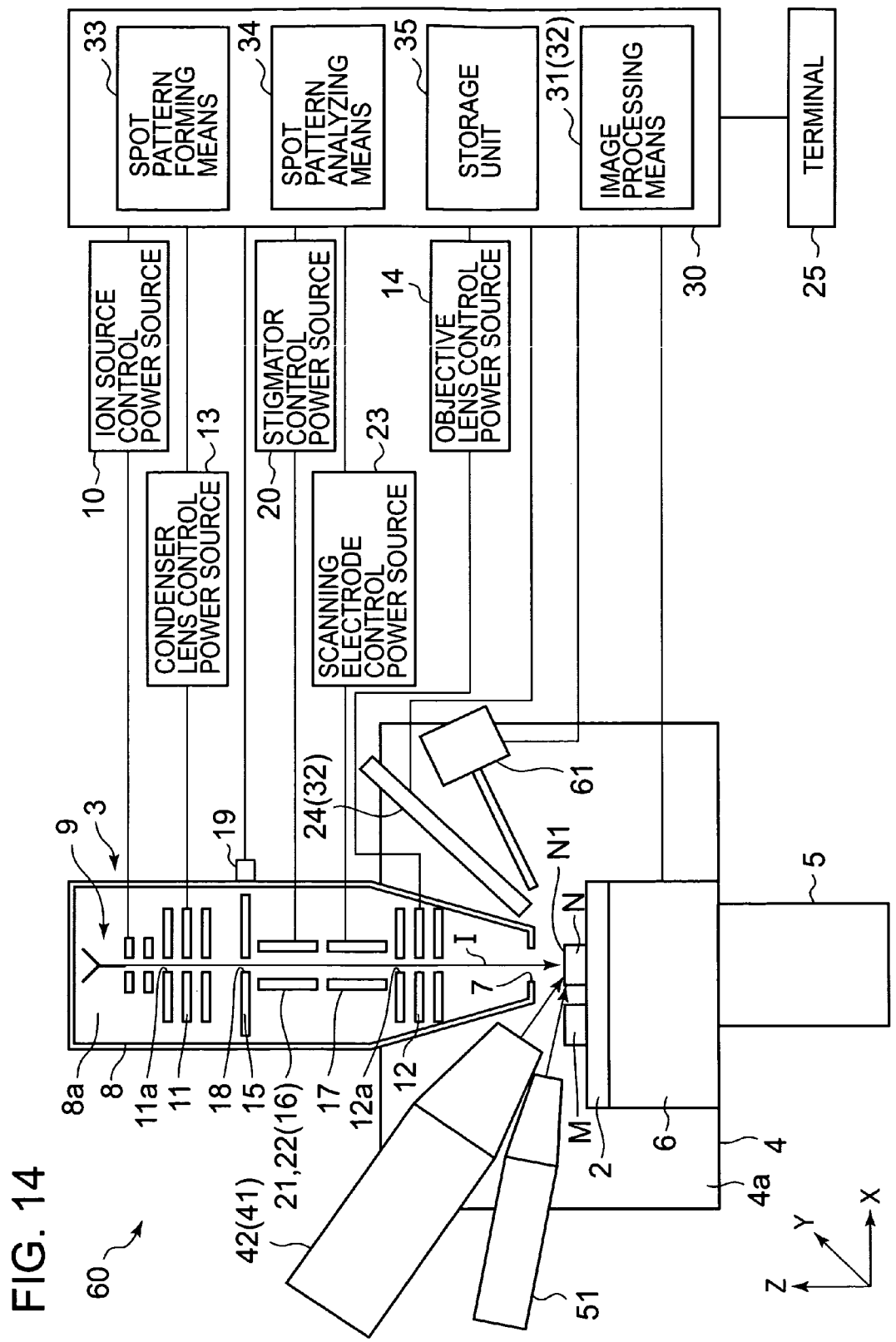
FIG. 14 is a configuration drawing of a charged particle beam apparatus according to a fourth embodiment of the present invention.
Figure 15:
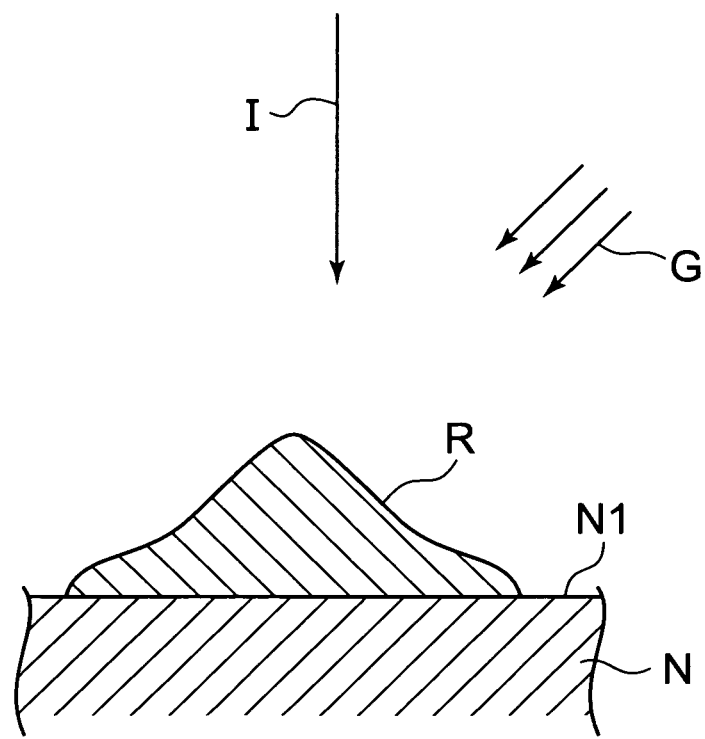
FIG. 15 is a detailed drawing of spot patterns formed in a spot pattern forming step according to the fourth embodiment of the present invention.

FIG. 14 and FIG. 15 show a fourth embodiment of the present invention. In this embodiment, common members as the members used in the embodiment described above are designated by the same reference numerals, and description will be omitted.

As shown in FIG. 14, a focused ion beam apparatus 60 in this embodiment further includes a gas introduction mechanism 61. In the focused ion beam apparatus 60, deposition is achieved by irradiating with the ion beam I and introducing organic gas onto the surface of the sample by the gas introduction mechanism 61. Therefore, in the focused ion beam apparatus 60 in this embodiment, the spot patterns are not formed by the etching of the sample, but the spot patterns may be formed by deposition in the spot pattern forming step. In other words, protruding spot patterns R as shown in FIG. 15 are formed at the positions of application by introducing organic gas G thereto by the gas introduction mechanism 61 and irradiating the same with the ion beam I. With the protruding spot pattern R, they can be identified from the image obtained by the observing means, and hence the adjustment of the objective lens or the stigmator as the charged particle optics is achieved on the basis of the similar spot patterns R.

Although the embodiments of the present invention have been described in detail referring to the drawings, detailed configurations are not limited to these embodiments, and modifications in design without departing the scope of the present invention are also included.

Incidentally, although the focused ion beam apparatus has been exemplified in the respective embodiments as the charged particle beam apparatus, the present invention is not limited thereto. For example, an ion beam exposure apparatus or the like is exemplified as the apparatus in which the ion beam is used as the charged particle beam in the same manner. Also, as the apparatus using the electron beam as the charged particle beam, a scanning electron microscope, an electron beam exposure apparatus, and so on are exemplified. In these apparatuses as well, by providing the same configuration as the control unit, the objective lens or the stigmator as the integrated charged particle optics are automatically and easily adjusted in a short time with a high degree of accuracy. As the standard sample, although those on which the spot patterns can be formed by the etching or the deposition is selected, in addition to it, a resist film is also selected. In this case, by irradiating the resist film as the standard sample with the charged particle beam for exposure, the same adjustment is achieved by the exposure pattern.

The invention claimed is:

1. A charged particle beam apparatus comprising:
a charged particle source configured to discharge a charged particle beam;
charged particle optics that adjusts the charged particle beam on the basis of an input voltage value;
scanning means for moving an irradiation point of the charged particle beam with respect to a sample;
observing means for obtaining an image of a surface of the sample irradiated with the charged particle beam; and
a control unit that sets an adjusted input voltage value to the charged particle optics, the control unit comprising spot pattern forming means for sequentially forming spot patterns at different positions on the sample surface in accordance with different voltage values input to the charged particle optics, and spot pattern analyzing means for analyzing the spot patterns on the image and selecting the adjusted input voltage value corresponding to a spot pattern having the smallest outer diameter and/or the most circular shape of the spot patterns.

2. The charged particle beam apparatus according to claim 1; wherein the spot pattern forming means of the control unit moves the irradiation point of the charged particle beam with respect to the sample by the scanning means by an amount obtained by multiplying the amount of change of the input voltage value by a predetermined coefficient every time when the charged particle beam is irradiated on the sample after setting the input voltage value to the different value.

3. The charged particle beam apparatus according to claim 1; wherein the charged particle optics includes an electrostatic lens configured to focus the charged particle beam to cause the sample to be irradiated therewith by applying a voltage to an electrode of the electrostatic lens, and the control unit causes the spot pattern forming means to form the spot patterns by setting voltage values to be applied to the electrode of the electrostatic lens to different values as the input voltage values and causes the spot pattern analyzing means to select and set the adjusted input voltage value to thereby adjust the focal length of the electrostatic lens.

4. The charged particle beam apparatus according to claim 1; further including a stigmator which includes a multi-pole having a pair of opposed positive poles and a pair of negative poles opposed substantially orthogonally to the direction of arrangement of the positive poles and which corrects the cross-sectional shape of the charged particle beam into a substantially circular shape by applying a voltage between each pair of positive and negative poles of the multi-pole, and wherein the control unit causes the spot pattern forming means to set the voltage value to be applied between the positive poles and the negative poles of the stigmator to different values as input voltage values to form spot patterns, and causes the spot pattern analyzing means to select the spot pattern having the smallest spot characteristic value as the ratio of the short diameter with respect to the long diameter of the outer diameters of the spot pattern in the orthogonal two directions, and set the voltage value to the voltage value corresponding to the spot pattern having the smallest value, so that the beam diameter ratio in the orthogonal two directions of the charged particle beam is adjusted.

5. The charged particle beam apparatus according to claim 4; wherein the spot pattern forming means of the control unit brings the charged particle beam into an over focus state with respect to the sample and forms a first plurality of spot patterns on the surface of the sample with different voltage values, and then brings the charged particle beam into an under focus state with respect to the sample and forms a second plurality of spot patterns on the surface of the sample with the same voltage values as in the case of the over focus state, respectively, and the spot pattern analyzing means of the control unit performs pattern matching between the spot patterns formed in the over focus state and in the under focus state with the same voltage values and selects the set of the spot patterns whose ratio of matching of pattern matching elements is the highest.

6. The charged particle beam apparatus according to claim 5; wherein the spot pattern forming means of the control unit matches the arrangement of the first and second pluralities of spot patterns to the corresponding voltage values between the state of the over focus and in the state of under focus to form the spot patterns.

7. The charged particle beam apparatus according to claim 4; wherein the stigmator includes two of the multi-poles including a first multi-pole and a second multi-pole, the voltage value includes a set of a first voltage value to be applied between the positive pole and the negative pole of the first multi-pole and a second voltage value to be applied between the positive pole and the negative pole of the second multi-pole, and the spot pattern forming means of the control unit combines the first voltage value and the second voltage value in different manners, moves the charged particle beam in a first direction by an amount obtained by multiplying an amount of change of the first voltage value by a predetermined coefficient and in a second direction intersecting the first direction by an amount obtained by multiplying an amount of change of the second voltage value by the coefficient relatively with respect to the sample by the scanning means, and causes the same to be applied a plurality of times.

8. The charged particle beam apparatus according to claim 1; wherein the observing means comprises a scanning electron microscope (SEM) column that scans the sample surface with an electron beam to obtain a SEM image of the sample surface having the spot patterns.

9. The charged particle beam apparatus according to claim 8; further comprising a rare gas ion beam column that irradiates the sample with a rare gas ion beam.

10. A method of adjusting charged particle optics of a charged particle beam apparatus which is configured to irradiate a sample with a charged particle beam and in which the charged particle optics is configured to adjust and set a beam characteristic value of the charged particle beam on the basis of the value of an input voltage applied to the charged particle optics, the method comprising: a spot pattern forming step for forming a plurality of discrete spot patterns at different positions on a surface of a sample by setting the input voltage of the charged particle optics to different value, each corresponding to a different one of the spot patterns, and irradiating the sample with the charged particle beam at different positions, each corresponding to a different one of the set input voltage values; an image forming step for forming an image of the sample surface that has been spot patterned by the charged particle beam; a spot pattern analyzing step for selecting from the image of spot patterns the spot pattern having the smallest value from spot characteristic values which indicate the shapes of the respective spot patterns; and an input voltage value setting step for setting the input voltage value of the charged particle optics to a value equal to the input value corresponding to the charged particle beam irradiated when the spot pattern selected in the spot pattern analyzing step is formed.

11. The method of adjusting charged particle optics according to claim 10; wherein the spot pattern forming step moves an irradiation point of the charged particle beam with respect to the sample by an amount obtained by multiplying an amount of change of the input voltage value by a predetermined coefficient every time when the charged particle beam is irradiated on the sample after setting the input voltage value to the different value.

12. The method of adjusting charged particle optics according to claim 10; wherein the charged particle beam apparatus includes an electrostatic lens configured to focus the charged particle beam to cause the sample to be irradiated therewith by applying a voltage to an electrode of the electrostatic lens, the spot pattern forming step forms the spot patterns by setting voltage values to be applied to the electrode of the electrostatic lens to different values as the input voltage values, and the spot pattern analyzing step selects the spot pattern having the smallest spot characteristic value as the outer diameter of the spot pattern, and sets the input voltage value by the input voltage value setting step, so that the focal length of the electrostatic lens as the beam characteristic value is adjusted.

13. The method of adjusting charged particle optics according to claim 10; wherein the charged particle beam apparatus includes a stigmator which includes a multi-pole having a pair of opposed positive poles and a pair of negative poles opposed substantially orthogonally to the direction of arrangement of the positive poles and which corrects the cross-sectional shape of the charged particle beam into a substantially circular shape by applying a voltage between each pair of positive and negative poles of the multi-pole, the voltage value to be applied between the positive poles and the negative poles of the stigmator is set to different values as input voltage values to form the spot patterns in the spot pattern forming step, the spot pattern having the smallest spot characteristic value is selected as the ratio of the short diameter with respect to the long diameter of the outer diameters of the spot pattern in the orthogonal two directions in the spot pattern analyzing step, and the input voltage value is set in the input voltage value setting step, so that the beam diameter ratio in the orthogonal two directions of the charged particle beam as the beam characteristic value is adjusted.

14. The method of adjusting charged particle optics according to claim 13; wherein the spot pattern forming step includes a first step of bringing the charged particle beam into an over focus state with respect to the sample and forming a first plurality of spot patterns on the surface of the sample with different voltage values, and a second step of bringing the charged particle beam into an under focus state with respect to the sample and forming a second plurality of spot patterns of the surface of the sample with the same voltage values as in the first step, respectively, and the spot pattern analyzing step performs pattern matching between the spot patterns formed in the first step and in the second step with the same voltage values and selects the set of the spot patterns whose ratio of matching of pattern matching elements is the highest.

15. The method of adjusting charged particle optics according to claim 14; wherein the first step and the second step of the spot pattern forming step match the arrangement of the first and second pluralities of spot patterns to the corresponding input voltage values to form the spot patterns.

16. The method of adjusting charged particle optics according to claim 13; wherein the stigmator of the charged particle beam apparatus includes two of the multi-poles including a first multi-pole and a second multi-pole, the voltage value includes a first voltage value to be applied between the positive pole and the negative pole of the first multi-pole and a second voltage value to be applied between the positive pole and the negative pole of the second multi-pole and, in the spot pattern forming step, the first voltage value and the second voltage value are combined in different manners, and the charged particle beam is moved in a first direction by an amount obtained by multiplying an amount of change of the first voltage value by a predetermined coefficient and in a second direction intersecting the first direction by an amount obtained by multiplying an amount of change of the second voltage value by the coefficient relatively with respect to the sample, and applied by a plurality of times.

17. The method of adjusting charged particle optics according to claim 10; wherein the spot pattern analyzing step compares the smallest spot characteristic value and a preset spot reference value and, if the spot characteristic value is larger than the spot reference value, the procedure goes again to the spot pattern forming step, and the spot pattern forming step changes the input voltage value by an amount of change smaller than the amount of change when the input voltage value of the charged particle optics is changed in the previous spot pattern forming step to form the spot pattern.

18. The method of adjusting charged particle optics according to claim 10; wherein in the spot pattern analyzing step, the input voltage value corresponding to the spot pattern having the smallest spot characteristic value is compared with the input voltage values corresponding to the other spot patterns and, if the input voltage value corresponding to the spot pattern having the smallest spot characteristic value is the smallest or the largest, the procedure goes to the spot pattern forming step again, and in the spot pattern forming step, the input voltage value is changed within a range including values smaller than the input voltage value if the input voltage value corresponding to the spot pattern having the smallest spot characteristic value is the smallest, and within a range including values larger than the input voltage value if the input voltage value is the largest to form the spot pattern again.

19. The method of adjusting charged particle optics according to claim 10; wherein the spot pattern analyzing step creates binary data obtained by binarizing the image of the sample on which the spot pattern is formed, and selects the spot pattern having the smallest spot characteristic value from the binary data.

20. The method of adjusting charged particle optics according to claim 10; further comprising an adjustment preparation step for arranging a standard sample and a target sample as the sample, and a processing and observation preparation step for adjusting the position of the target sample with respect to the irradiation point of the charged particle beam, wherein the spot pattern forming step, the spot pattern analyzing step, and the input voltage value setting step for the standard sample are performed after the adjustment preparation step, and the processing and observation preparation step is carried out after the input voltage value setting step.

21. The method of adjusting charged particle optics according to claim 10; wherein the image forming step is performed using a scanning electron microscope (SEM) column to obtain a SEM image of the sample surface that has been spot patterned by the charged particle beam.

* * * * *